US007501878B2

(12) United States Patent
Suzuki et al.

(10) Patent No.: US 7,501,878 B2
(45) Date of Patent: Mar. 10, 2009

(54) AMPLITUDE SETTING CIRCUIT

(75) Inventors: Hirohisa Suzuki, Gunma (JP); Kazuo Hasegawa, Gunma (JP); Eiji Akama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 180 days.

(21) Appl. No.: 11/276,140

(22) Filed: Feb. 15, 2006

(65) Prior Publication Data
US 2006/0192605 A1 Aug. 31, 2006

(30) Foreign Application Priority Data
Feb. 16, 2005 (JP) ............................. 2005-039801

(51) Int. Cl.
*H03K 17/14* (2006.01)
(52) U.S. Cl. ........................ 327/378; 327/262; 327/538; 327/58
(58) Field of Classification Search ................. 327/262, 327/378, 538, 58, 536
See application file for complete search history.

(56) References Cited
U.S. PATENT DOCUMENTS
5,544,120 A * 8/1996 Kuwagata et al. ........... 365/222

6,163,195 A * 12/2000 Jefferson ..................... 327/262

FOREIGN PATENT DOCUMENTS
JP 2001-119442 4/2001

* cited by examiner

*Primary Examiner*—Kenneth B Wells
*Assistant Examiner*—Ryan C Jager
(74) *Attorney, Agent, or Firm*—Fish & Richardson P.C.

(57) ABSTRACT

An amplitude setting circuit for setting an amplitude level of its output signal corresponding to an input signal. By setting a current flowing through a first diode-connected transistor (Q5) and a current flowing through a first drive transistor (Q1) to be in a predetermined relationship, variation with temperature in potential at a first connection point of the first drive transistor (Q1) and a first conductivity-type transistor (M1) is removed, and by setting a current flowing through a second diode-connected transistor (Q6) and a current flowing through a second drive transistor (Q4) to be in a predetermined relationship, variation with temperature in potential at a second connection point of a second conductivity-type transistor (M2) and the second drive transistor (Q4) is removed.

13 Claims, 20 Drawing Sheets

AMPLITUDE SETTING CIRCUIT

CROSS-REFERENCE TO RELATED APPLICATIONS

The present application claims priority from Japanese Patent Application No. 2005-39801 filed on Feb. 16, 2005, which is herein incorporated by reference.

BACKGROUND OF THE INVENTION

1. Field of the Invention

The present invention relates to an amplitude setting circuit.

2. Description of the Related Art

Through communication networks such as LANs in offices and vehicle-mounted networks, digital signals are transmitted between apparatuses in the form of signals of various formats. Communication networks are beginning to be used to connect various digital apparatuses other than computers as well as being used to connect computers and their peripherals. An example thereof is vehicle-mounted networks and, for example, a MOST (Media Oriented Systems Transport) system has been proposed as a standard for vehicle-mounted networks. In the MOST system, a ring-like vehicle-mounted network is configured, and various apparatuses such as a car navigation system, a CD/DVD player, a speaker, a display, a telephone are connected to the network. The vehicle-mounted network is used, for example, in a way that the CD/DVD player transmits a reproduced digital signal to the speaker via the vehicle-mounted network and that the speaker converts the digital signal into voice and outputs.

As a digital signal transmission method in a communication network, there are a base band method in which a digital signal is transmitted as it is and a broad band method in which an analog signal obtained by modulating a carrier wave with a digital signal is transmitted. An amplitude shift keying method as a broad band method will be described in detail below.

FIG. 19 is a diagram illustrating the configuration of a conventional ASK modulation circuit. The ASK modulation circuit of FIG. 19 has transmit data D, that is serial digital data, inputted thereto and generates an ASK modulated signal S whose amplitude varies in response to changes in the bit value of the transmit data D over time and outputs to a network.

With reference to the waveforms of main signals of the conventional ASK modulation circuit of FIG. 20 as needed, the configuration of the ASK modulation circuit of FIG. 19 will be described.

A reference clock generator 10 generates a clock signal CL of a frequency proportional to the bit rate of the transmit data D. Let r be the bit rate (bps) of the transmit data D, then the frequency of the clock signal CL is expressed as n (natural number)×r (Hz).

Amplifiers 12, 14 each have the clock signal CL of a rectangular waveform inputted thereto and have their output amplitude level decided by a predetermined gain. For example, the amplifiers 12, 14 produce respective clock signals CL1, CL2 of a rectangular waveform that swing to their peak and bottom with ground potential (zero level) as their reference (see (a), (b) of FIG. 20). Note that the clock signals CL1, CL2 are set to have amplitude levels different from each other.

A switching controller 20 latches the bit value of the transmit data D synchronously with the clock signal CL and depending on the latched bit value, generates a control signal SW to control the on/off of switches 16, 18 (see (c) of FIG. 20).

The switches 16, 18 switch on/off complementarily according to the control signal SW supplied from the switching controller 20. For example, when the control signal SW is at a High (H) level, the switch 16 is off and the switch 18 is on. When the control signal SW is at a Low (L) level, the switch 16 is on and the switch 18 is off. A combined signal M of the outputs of the switches 16, 18 (see (d) of FIG. 20) is input to an LPF 22.

The LPF 22 removes high frequency components from the combined signal of the outputs of the switches 16, 18 and produces the ASK modulated signal S of a smooth sine waveform (see (e) of FIG. 20).

Such a conventional ASK modulation circuit is disclosed in, for example, Japanese Patent Application Laid-Open Publication No. 2001-119442.

Fixed gain amplifiers like the amplifiers 12, 14 of FIG. 19 and variable gain amplifiers such as an electronic volume and an attenuator are amplitude setting circuits that set the amplitude level of their output signal corresponding to an input signal. These conventional amplitude setting circuits have the problem that their amplifier circuit elements have a temperature characteristic and thus their gains vary with temperature. Therefore, the output signal having a set amplitude level varies in amplitude with temperature.

SUMMARY OF THE INVENTION

According to a main aspect of the present invention to solve the above problem, there is provided an amplitude setting circuit for setting an amplitude level of its output signal corresponding to an input signal. The amplitude setting circuit comprises an inverter that has a first conductivity-type transistor (M1) and a second conductivity-type transistor (M2) connected in series in between a source power line and a sink power line which complementarily become conductive and outputs the output signal into which the input signal has been inverted in logic level; a first drive transistor (Q1) that is provided between the source power line and the first conductivity-type transistor (M1) and drives the first conductivity-type transistor (M1); a second drive transistor (Q4) that is provided between the second conductivity-type transistor (M2) and the sink power line and drives the second conductivity-type transistor (M2); a voltage divider that has a first resistor (R1), a first diode-connected transistor (Q5), a second resistor (R3), a third resistor (R4), a second diode-connected transistor (Q6), and a fourth resistor (R6) connected in series between the source power line and the sink power line and applies potential of a control electrode of the first diode-connected transistor (Q5) to a control electrode of the first drive transistor (Q1) and applies potential of a control electrode of the second diode-connected transistor (Q6) to a control electrode of the second drive transistor (Q4); a fifth resistor (R5) that is provided between a first connection point of the first drive transistor (Q1) and the first conductivity-type transistor (M1), and the sink power line and adjusts a current flowing through the first drive transistor (Q1); and a sixth resistor (R2) that is provided between the source power line and a second connection point of the second conductivity-type transistor (M2) and the second drive transistor (Q4) and adjusts a current flowing through the second drive transistor (Q4). By setting a current flowing through the first diode-connected transistor (Q5) and the current flowing through the first drive transistor (Q1) to be in a predetermined relationship, variation with temperature in potential at the first connection point is removed, and by setting a current flowing through the second diode-connected transistor (Q6) and the current flowing through the second drive transistor (Q4) to be in a predetermined relationship, variation with temperature in potential at the second connection point is removed.

According to the invention, there is provided an amplitude setting circuit, the set amplitude level of whose output is stabilized against temperature variation.

Features and objects of the present invention other than the above will become apparent from the description of this specification and the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

Fundamental Configuration of Amplitude Setting Circuit

Figure 1:
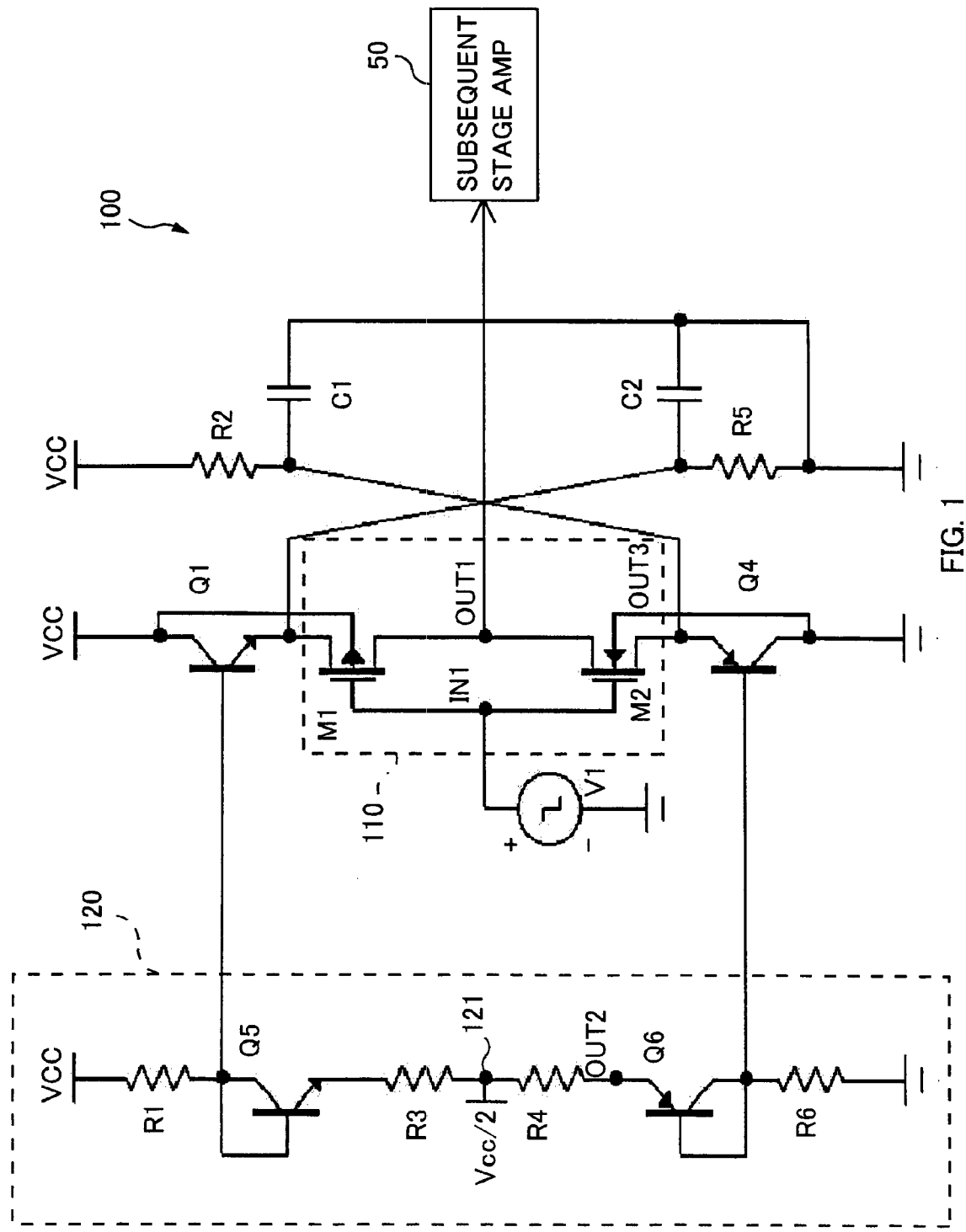
FIG. 1 is a diagram illustrating the fundamental configuration of an amplitude setting circuit according to the present invention.
Figure 20:
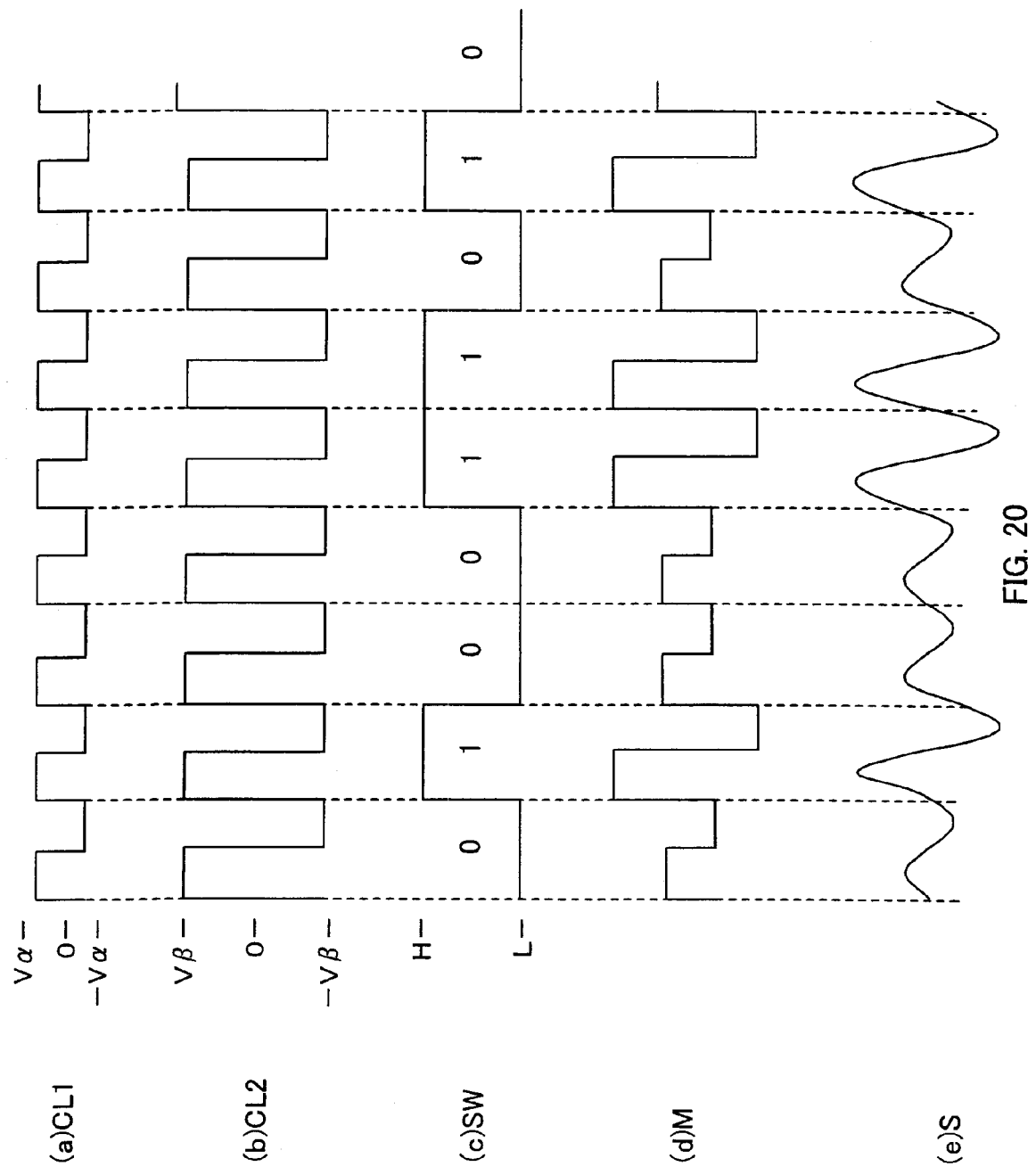
FIG. 20 is a diagram showing the waveforms of main signals of the conventional ASK modulation circuit.

FIG. 1 is a diagram illustrating the fundamental configuration of an amplitude setting circuit 100 according to the present invention. The amplitude setting circuit 100 is for setting an amplitude level of its output signal VOUT1 that is the inverse in logic of a rectangular waveform input signal VIN1. The amplitude setting circuit 100 is used as a circuit for setting the amplitude level (peak level/bottom level) of a clock signal in an ASK modulation circuit, such as amplifiers 12, 14 of FIG. 20.

An inverter 110 is formed in between a source power line (Vcc potential) and a sink power line (GND potential) by a first conductivity-type transistor M1 on the source power line side and a second conductivity-type transistor M2 on the sink power line side. Their control electrodes are connected in common and the rectangular waveform input signal VIN1 having an amplitude level V1 is applied to the common connection point. The first conductivity-type transistor M1 and the second conductivity-type transistor M2 complementarily become conductive according to the input voltage signal VIN1 switching in logic level. In this implementation, the first conductivity-type transistor M1 is a P-MOS transistor and the second conductivity-type transistor M2 is an N-MOS transistor.

A first drive transistor Q1 is provided between the source power line and the first conductivity-type transistor M1 and drives the first conductivity-type transistor M1. In this implementation, the first drive transistor Q1 is an NPN bipolar transistor and connected to form an emitter follower circuit.

A second drive transistor Q4 is provided between the second conductivity-type transistor M2 and the sink power line and drives the second conductivity-type transistor M2. In this implementation, the second drive transistor Q4 is a PNP bipolar transistor and connected to form an emitter follower circuit.

A voltage divider 120 has a first resistor R1, a first transistor Q5, a second resistor R3, a third resistor R4, first and second diode-connected transistors (Q5, Q6) connected in series, and a fourth resistor R6, which are connected in series. In the voltage divider 120, a current (hereinafter called a reference side current Ir) flows from the source power line to the sink power line which depends on the potential difference between the source power line and the sink power line, the resistances of the first to fourth resistors (R1, R3, R4, R6), and the forward voltages of the first and second diode-connected transistors (Q5, Q6).

Furthermore, in the voltage divider 120 a voltage at the control electrode of the first diode-connected transistor Q5 is applied to the control electrode of the first drive transistor Q1, and a voltage at the control electrode of the second diode-connected transistor Q6 is applied to the control electrode of the second drive transistor Q4. That is, the first diode-connected transistor Q5 and the first drive transistor Q1 form a current mirror circuit, and the second diode-connected transistor Q6 and the second drive transistor Q4 form a current mirror circuit. The potential at the control electrode of the first diode-connected transistor Q5 corresponds to the peak level to be set of the output signal VOUT1 plus the forward voltage of the first diode-connected transistor Q5, and the potential at the control electrode of the second diode-connected transistor Q6 corresponds to the bottom level to be set of the output signal VOUT1 minus the forward voltage of the second diode-connected transistor Q6.

In the voltage divider 120, the connection point of the second and third resistors R3, R4 is used as a reference voltage application point 121. A reference voltage applied to the reference voltage application point 121 is of the same level as the operating voltage of a subsequent stage amplifier 50 connected at the subsequent stage to the inverter 110. The operating voltage of a subsequent stage amplifier 50 is half the potential difference between the source power line and the sink power line (Vcc/2).

In this implementation, the first diode-connected transistor Q5 is an NPN bipolar transistor and the second diode-connected transistor Q6 is a PNP bipolar transistor. That is, the diode connection of the first and second diode-connected transistors (Q5, Q6) is implemented by connecting their base and collector electrodes.

A fifth resistor R5 is provided between a first connection point of the first drive transistor Q1 and the first conductivity-type transistor M1, and the sink power line and adjusts the emitter current flowing through the first drive transistor Q1 (hereinafter called an H-side current Ih).

A sixth resistor R2 is provided between the source power line and a second connection point of the second conductivity-type transistor M2 and the second drive transistor Q4 and adjusts the emitter current flowing through the second drive transistor Q4 (hereinafter called an L-side current Il).

A first capacitor C1 has its one electrode connected to the sink power line and the other electrode connected to the connection point of the sixth resistor R2 and the second drive transistor Q4.

A second capacitor C2 has its one electrode connected to the sink power line and the other electrode connected to the connection point of the first drive transistor Q1 and the fifth resistor R5.

The amplitude setting circuit 100, with the above configuration, sets the reference side current Ir flowing through the first diode-connected transistor Q5 and the H-side current Ih flowing through the first drive transistor Q1 to be in a predetermined relationship, thereby removing variation with temperature in the potential at the first connection point, and sets the reference side current Ir flowing through the second diode-connected transistor Q6 and the L-side current Il flowing through the second drive transistor Q4 to be in a predetermined relationship, thereby removing variation with temperature in the potential at the second connection point. When the first conductivity-type transistor M1 is conductive, the potential at the first connection point becomes the peak level of the output signal VOUT1 of the inverter 110, and when the second conductivity-type transistor M2 is conductive, the potential at the second connection point becomes the bottom level of the output signal VOUT1 of the inverter 110. As a result of removing variation with temperature in the potential at the first and second connection points, the output signal VOUT1 of the inverter 110 is stabilized against temperature variation.

Moreover, in the amplitude setting circuit 100 with the above configuration including the capacitors C1, C2, when the first conductivity-type transistor M1 is non-conductive, the capacitor C2 is charged in preparation, and when the second conductivity-type transistor M2 is non-conductive, the capacitor C1 is charged in preparation. The charging voltages across the capacitors C1, C2 prevent the waveform of the output signal VOUT1 from becoming gentle in transition that would otherwise occur due to a current flowing into the subsequent stage amplifier 50 when the input voltage signal VIN1 switches in logic level, thus improving capability of the output signal VOUT1 to follow the input signal VIN1.

In the above configuration of the amplitude setting circuit 100, the reference voltage application point 121 is provided in the voltage divider 120. Amplifiers like the subsequent stage amplifier 50 generally need to be supplied with a predetermined bias voltage. To this end, the output signal VOUT1 of the inverter 110 needs to have its DC component shifted to that bias voltage and then be supplied to the subsequent stage amplifier 50. However, since the reference voltage applied to the reference voltage application point 121 is set to be the same level as the reference operating voltage of the subsequent stage amplifier 50, the above shifting is not necessary. As a result, the subsequent stage amplifier 50 can be connected directly to the inverter 110 without capacitor coupling.

The reference voltage applied to the reference voltage application point 121 is half the potential difference between the source power line and the sink power line. Thus, cases where the amplitude level either on the peak side or the bottom side of the output signal VOUT1 of the inverter 110 is saturated disabling the amplitude setting can be easily prevented from occurring thus rendering the peak and bottom levels of the output signal VOUT1 balanced.

In the amplitude setting circuit 100, bipolar transistors are used as the first and second diode-connected transistors (Q5, Q6) and the first and second drive transistors (Q1, Q4). Compared with the case of adopting MOS transistors, the consumption current of the entire amplitude setting circuit 100 can be reduced. Also, compared with adopting MOS transistors that operate at a low voltage, the operating voltage range is wide. Hence, the setting range for the amplitude level of the output signal VOUT1 of the inverter 110 can be expanded.

First Implementation

Figure 2:
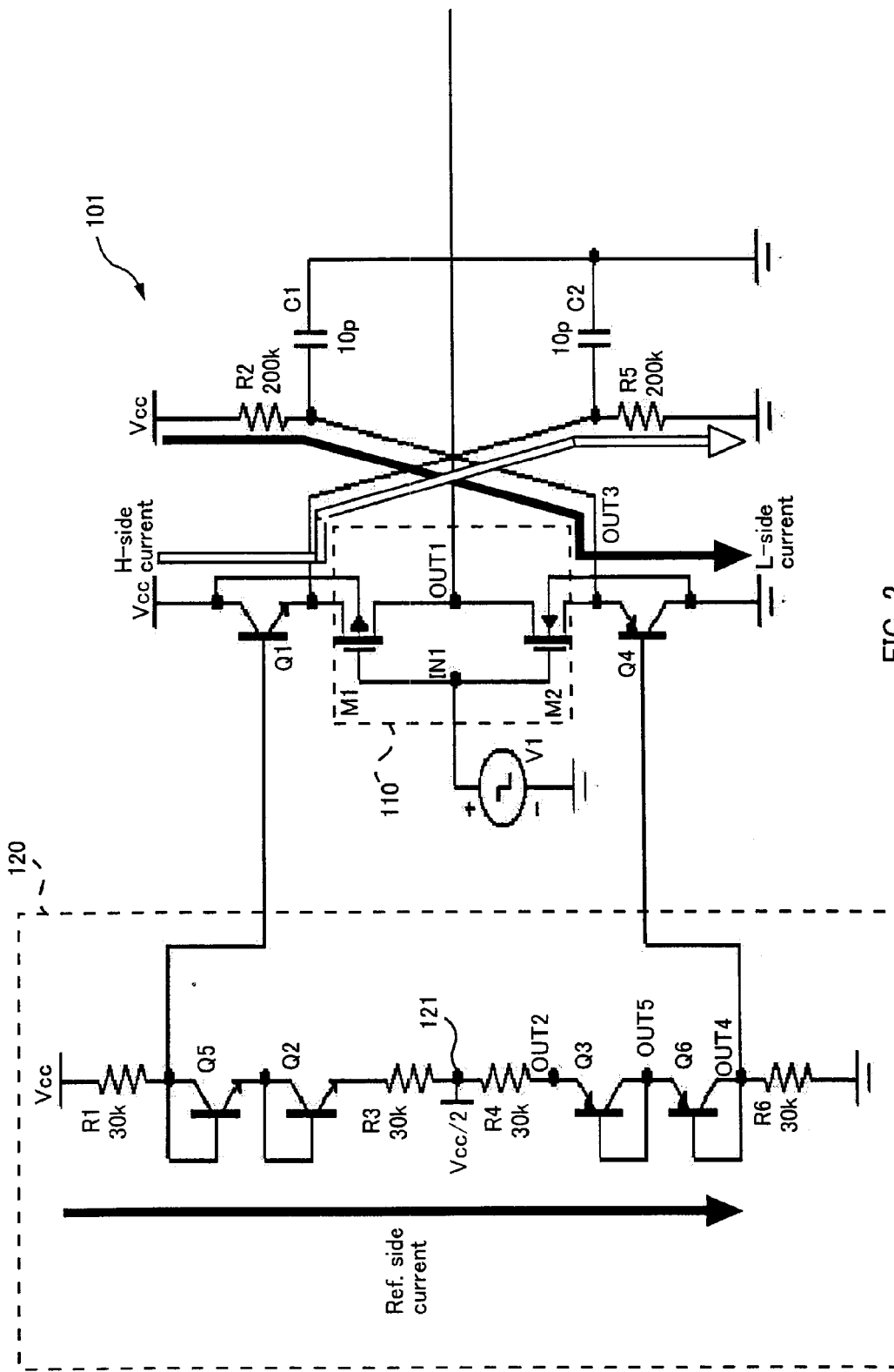
FIG. 2 is a diagram illustrating the configuration of an amplitude setting circuit (case of the amplitude level being Vcc/4) according to a first implementation of the present invention.
Figure 3:
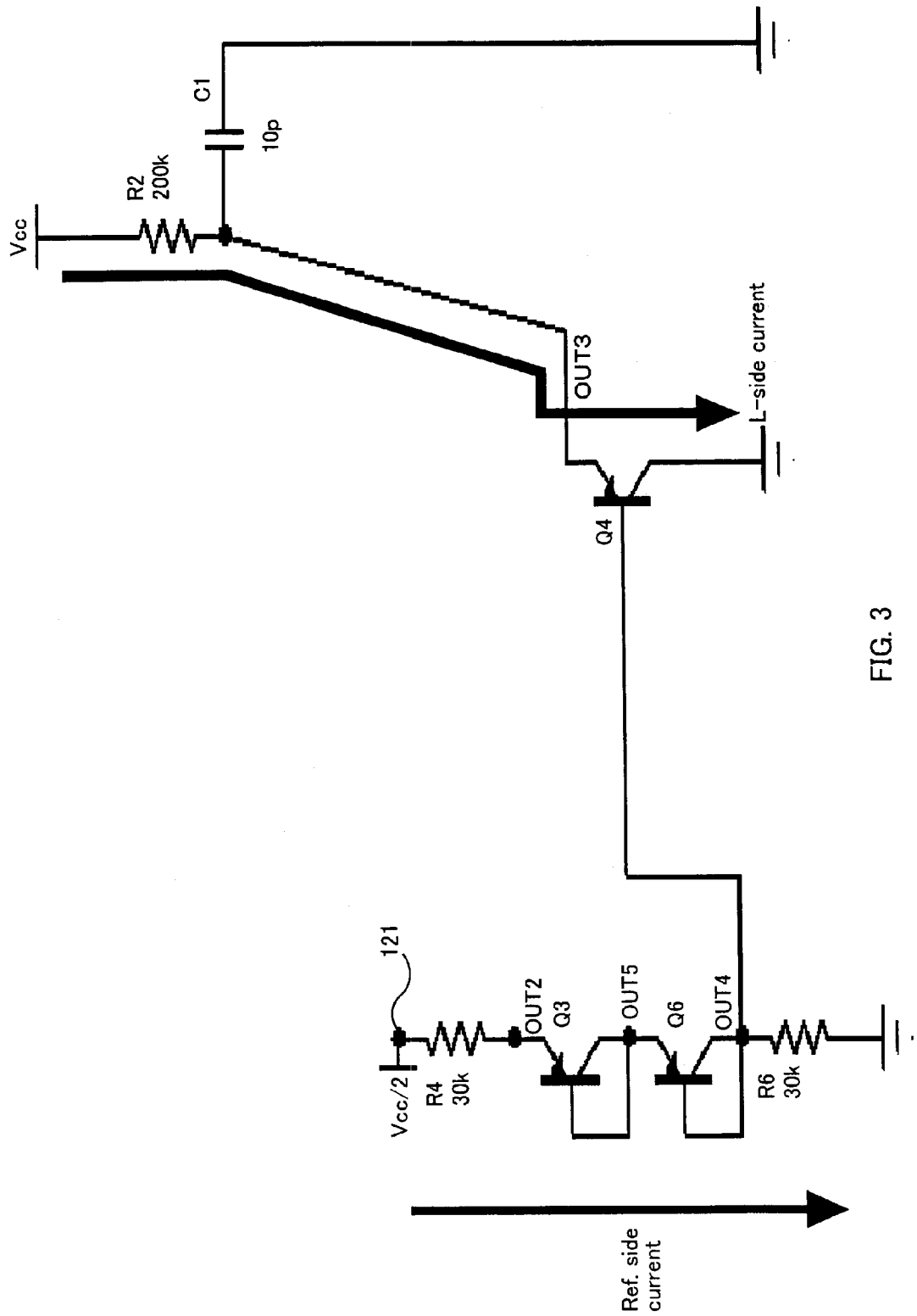
FIG. 3 is a diagram illustrating the configuration on the sink power line side of the amplitude setting circuit (case of the amplitude level being Vcc/4) according to the first implementation of the present invention.

<<Case of Amplitude Level being Set to Vcc/4>>
==Configuration of Amplitude Setting Circuit==
FIG. 2 is a diagram illustrating the configuration of an amplitude setting circuit 101 according to a first implementation of the invention. The amplitude setting circuit 101 is for setting the amplitude level of its output signal VOUT1, that is the inverse in logic of the rectangular waveform input signal VIN1, to be one quarter (e.g., potential of Vcc/4) of the potential difference between the source power line (e.g., Vcc potential) and the sink power line (e.g., GND potential).

The amplitude setting circuit 101 differs from the fundamental configuration of FIG. 1 in that in the voltage divider 120 two first diode-connected transistors (Q5, Q2) are connected in series between the first resistor R1 and the second resistor R3 and that two second diode-connected transistors (Q3, Q6) are connected in series between the third resistor R4 and the fourth resistor R6. The two first diode-connected transistors (Q5, Q2) are the same NPN bipolar transistor as the first drive transistor Q1, and the two second diode-connected transistors (Q3, Q6) are the same PNP bipolar transistor as the second drive transistor Q4.

The amplitude setting circuit 101, with the above configuration, sets the reference side current Ir flowing through the first diode-connected transistor Q5 and the H-side current Ih flowing through the first drive transistor Q1 to be nearly equal, thereby removing variation with temperature in the potential at the first connection point, and sets the reference side current Ir flowing through the second diode-connected transistor Q6 and the L-side current Il flowing through the second drive transistor Q4 to be nearly equal, thereby removing variation with temperature in the potential at the second connection point.

==Operation of Amplitude setting Circuit==
The operation of the amplitude setting circuit 101 will be described with reference to the configuration on the sink power line side of the amplitude setting circuit 101 for simplification of description.

First, take a target value for the reference side current Ir, the H-side current Ih, and the L-side current Il to be 20 µA, the base-to-emitter voltages of the two second diode-connected transistors (Q3, Q6) (hereinafter called Q3VBE, Q6VBE) and of the second drive transistor Q4 (hereinafter called Q4VBE) to be 0.65 V, and Vcc potential of the source power line and GND potential of the sink power line to be 5.0 V and 0.0 V respectively. In this case, the reference voltage (Vcc/2) that is applied to the reference voltage application point 121 is 2.5 V.

Assume that the resistances of the third resistor R4 and the fourth resistor R6 are equal. Under these conditions, its resistance to cause the reference side current Ir of 20 µA to flow through the voltage divider 120 is 60 kΩ as shown by the equation (1), and thus, the resistances of the third resistor R4 and the fourth resistor R6 are 30 kΩ each:

$$R4+R6=(2.5\,V-2\times0.65\,V)\div20\,\mu A=60\,k\Omega \quad (1)$$

Meanwhile, the resistance of the sixth resistor R2 to cause the L-side current Il to flow is 200 kΩ as shown by the equation (2):

$$R2=(5.0\,V-0.65\,V)\div20\,\mu A\approx200\,k\Omega \quad (2)$$

In this way, so as to set the reference side current Ir and the L-side current Il nearly equal, the resistances of the third, fourth, and sixth resistors R4, R6, R2 are set. Because the reference side current Ir and the L-side current Il are set nearly equal, the Q3VBE, Q4VBE, and Q6VBE are nearly equal.

Figure 4:
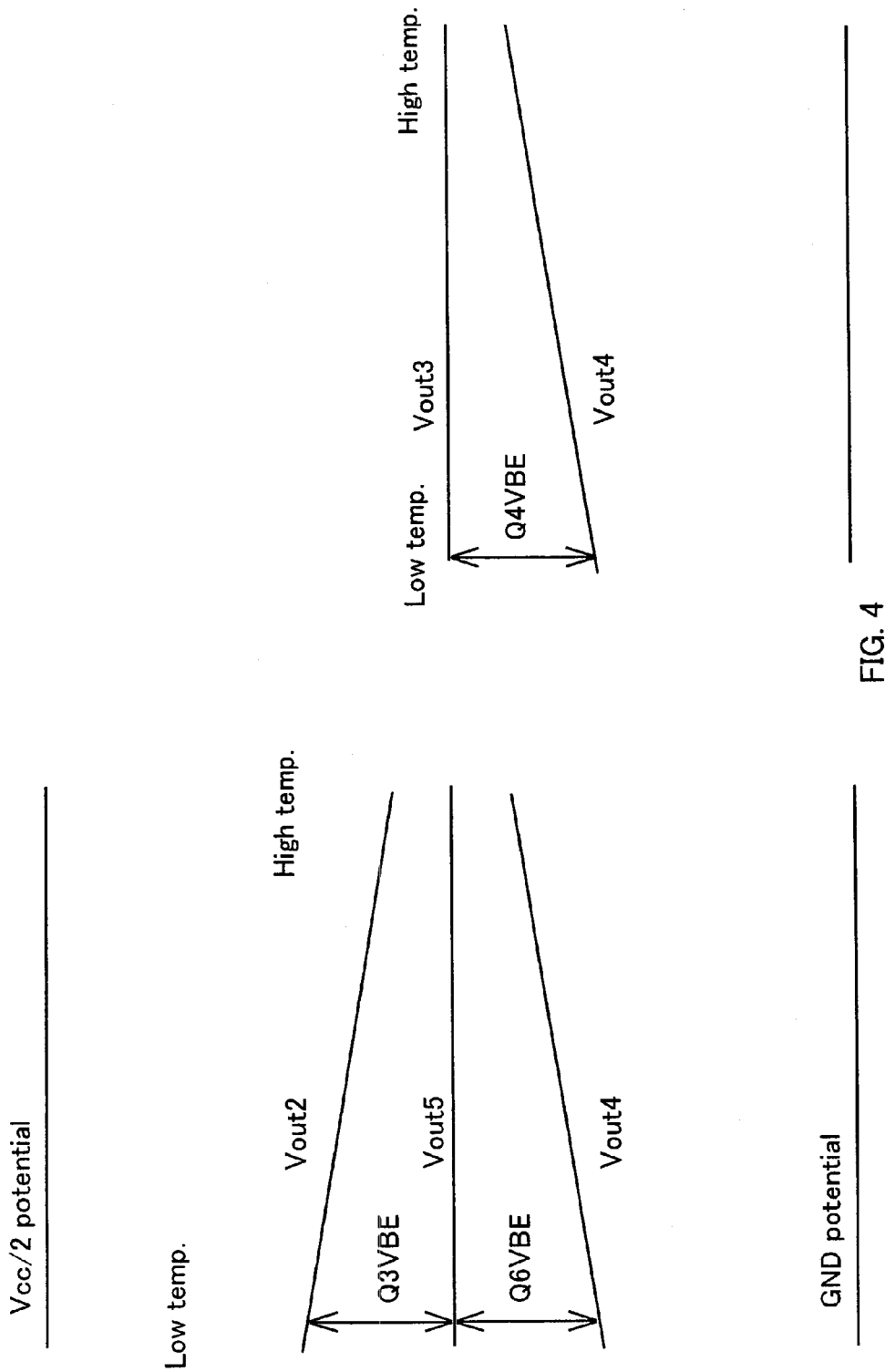
FIG. 4 is a diagram schematically showing the temperature characteristics of main signals of the amplitude setting circuit (case of the amplitude level being Vcc/4) according to the first implementation of the present invention.

FIG. 4 shows schematically temperature characteristics of the potentials at main strobe points in the amplitude setting circuit 101.

Figure 17:
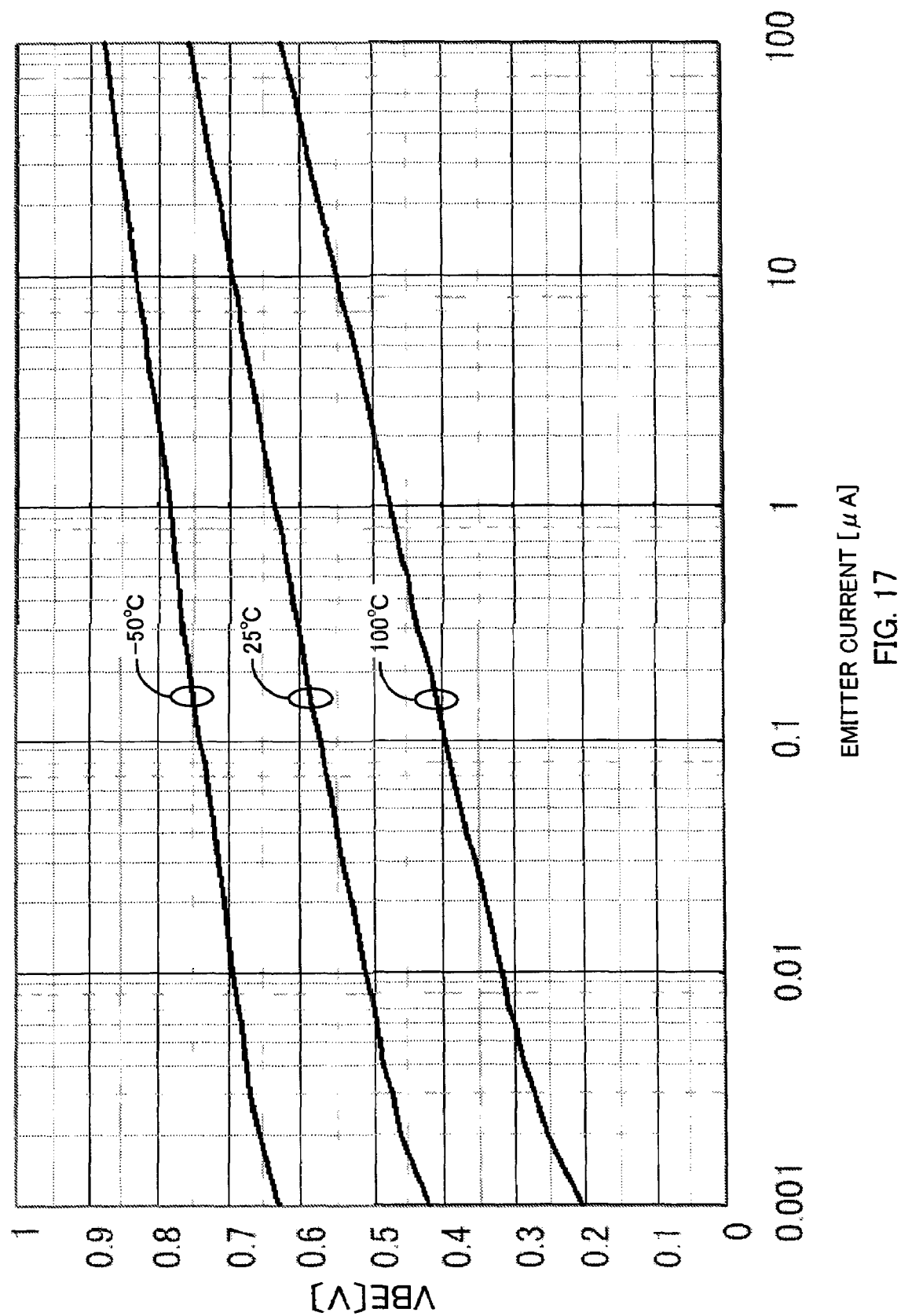
FIG. 17 is a diagram showing the temperature characteristic of a base-to-emitter voltage according to the invention.

The base-to-emitter voltage of transistors usually has a characteristic as shown in FIG. 17 of decreasing as temperature goes from low to high. Furthermore, VOUT2, potential at the connection point of the third resistor R4 and the second diode-connected transistor Q3, and VOUT4, potential at the connection point of the second diode-connected transistor Q6 and the fourth resistor R6, are expressed by the equations (3), (4) below. Since the right side of the equation (3) and the second term of the right side of the equation (4) are equal, as temperature goes from low to high, potential VOUT2 descends and potential VOUT4 ascends at the same gradient. That is, VOUT2 and VOUT4 have temperature characteristics opposite to each other:

$$VOUT2=R6\times Ir+Q3VBE+Q6VBE \quad (3)$$

$$VOUT4=Vcc/2-(R4\times Ir+Q3VBE+Q6VBE) \quad (4)$$

Potential at the connection point of the two second diode-connected transistors (Q3, Q6), VOUT5, is expressed by the equation (5). Since VOUT2 and VOUT4 have temperature characteristics opposite to each other and Q6VBE and Q3VBE are nearly equal, variation in VOUT5 with temperature is removed. VOUT5 is the middle potential of Vcc/4 between potential of Vcc/2 and GND potential:

$$VOUT5=VOUT4+Q6VBE=VOUT2-Q3VBE \quad (5)$$

Meanwhile, potential at the connection point of the sixth resistor R2 and the second drive transistor Q4, VOUT3, is higher by Q4VBE than VOUT4 as shown in the equation (6). Here, since Q4VBE and Q6VBE are nearly equal, it is seen from the equations (5) and (6) that VOUT3 and VOUT5 are at the same potential and have the same temperature characteristic. That is, variation in VOUT3 with temperature is removed:

$$VOUT3=VOUT4+Q4VBE \quad (6)$$

Figure 5:
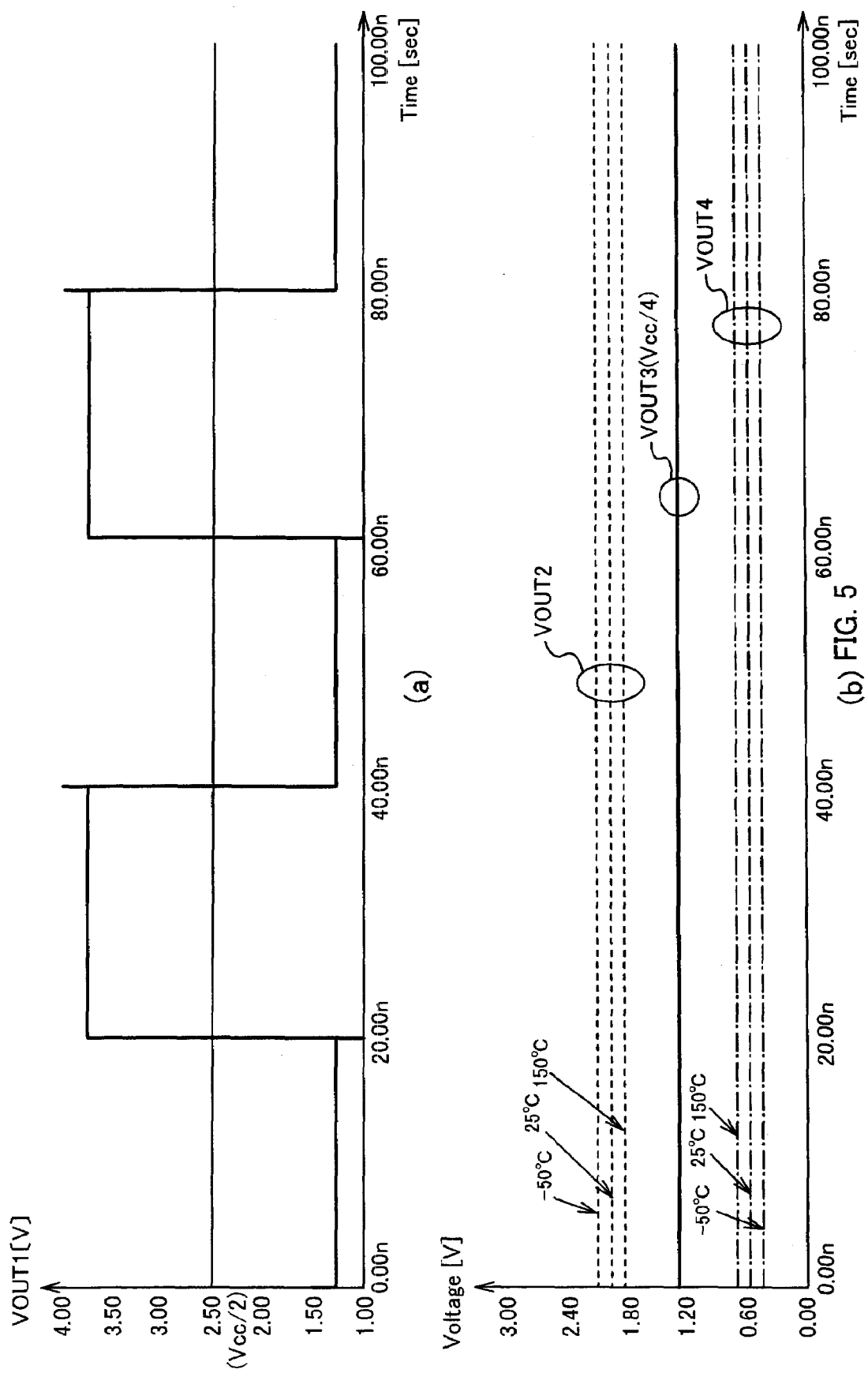
FIG. 5 shows (a) the waveform of an output signal VOUT1 of the amplitude setting circuit (case of the amplitude level being Vcc/4) according to the first implementation of the invention and (b) the temperature characteristics of main signals of the amplitude setting circuit (case of the amplitude level being Vcc/4) according to the first implementation of the invention.

FIG. 5 shows simulation waveforms of main signals of the amplitude setting circuit 101. FIG. 5(a) shows the simulation waveform of the output signal VOUT1 of the inverter 110, and FIG. 5(b) shows the simulation waveforms of main strobe points VOUT2, VOUT3, VOUT4 of the amplitude setting circuit 101 for temperature of −50, 25, and 150° C. respectively.

As shown in FIG. 5(b), it is seen that variation in VOUT3 with temperature is removed by VOUT2 and VOUT4 having temperature characteristics opposite to each other and that as a result, as shown in FIG. 5(a) variation with temperature in the output signal VOUT1 of the inverter 110 is also removed.

Although the above description has been made with reference to the configuration on the sink power line side of the amplitude setting circuit 101, a similar description applies to the configuration on the source power line side of the amplitude setting circuit 101, in which case potential at the connection point of the two first diode-connected transistors (Q5, Q2) is three fourths of the potential difference between the source power line and the sink power line (potential of 3Vcc/4). Because of the base-to-emitter voltages of the first diode-connected transistors (Q5, Q2) having temperature characteristics opposite to each other, variation with temperature in potential at the connection point of the first diode-connected transistors (Q5, Q2) is removed. Also, potential at the connection point of the first drive transistor Q1 and the fifth resistor R5 is at the same level and has the same temperature characteristic as the potential at the connection point of the first diode-connected transistors (Q5, Q2).

<<Case of Amplitude Level Setting Deviating from Vcc/4>>

Figure 6:
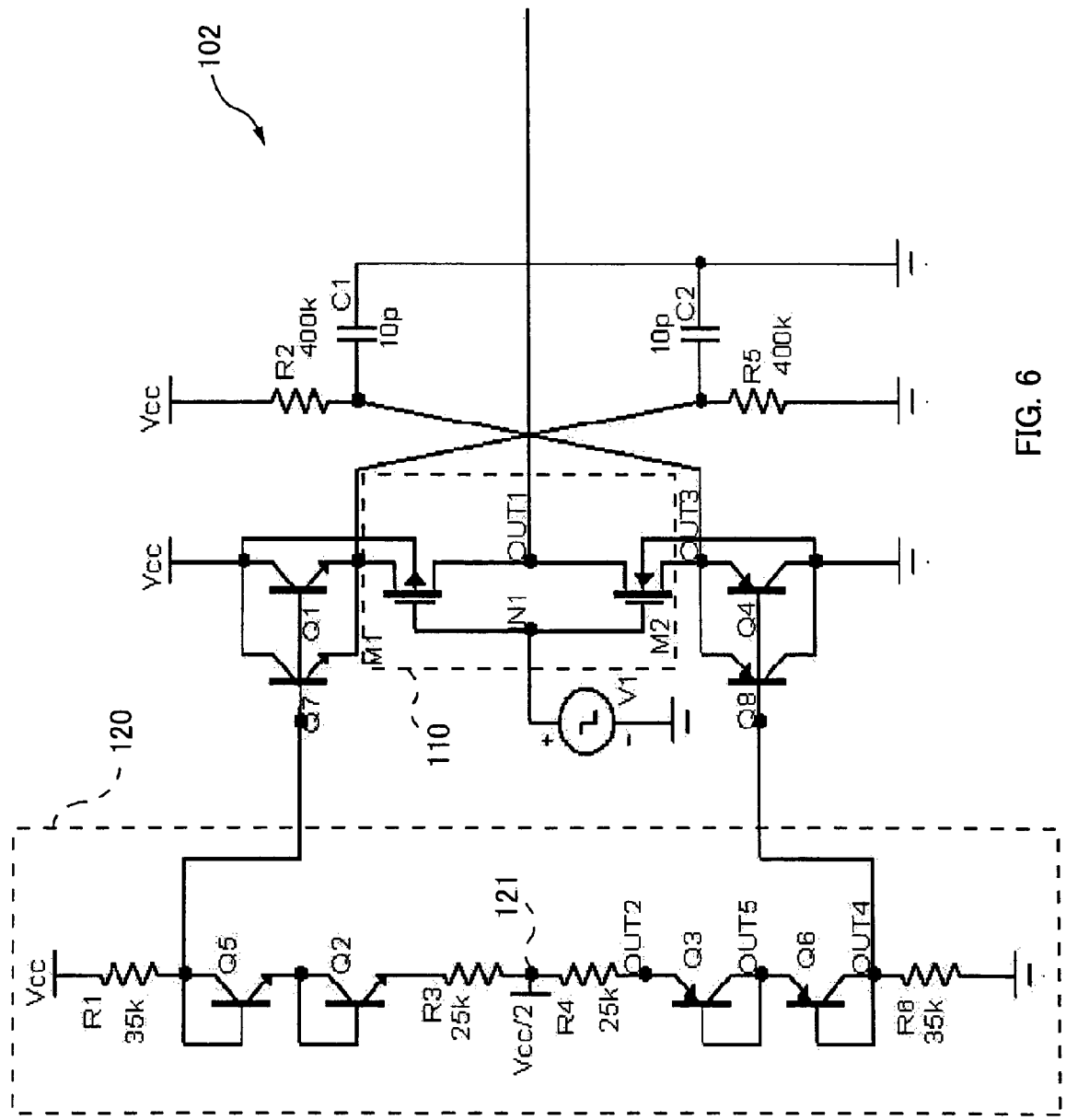
FIG. 6 is a diagram illustrating the configuration of another amplitude setting circuit (case of the amplitude level deviating from Vcc/4) according to the first implementation of the invention.

FIG. 6 is a diagram illustrating the configuration of an amplitude setting circuit 102 according to the first implementation of the invention. The amplitude setting circuit 102 is for setting the amplitude level of its output signal VOUT1, that is the inverse in logic of the rectangular waveform input signal VIN1, to deviate from one quarter (e.g., potential of Vcc/4) of the potential difference between the source power line (e.g., Vcc potential) and the sink power line (e.g., GND potential).

Specifically, by adjusting the resistances of the voltage divider 120, the potential at the connection point of the first diode-connected transistors (Q5, Q2) is set to deviate from potential of 3Vcc/4, and the potential at the connection point of the second diode-connected transistors (Q6, Q3) is set to deviate from potential of Vcc/4. In an example of numerical values shown in FIG. 6, the resistances of the first resistor R1 and fourth resistor R6 are 35 kΩ and the resistances of the second resistor R3 and third resistor R4 are 25 kΩ.

Figure 7:
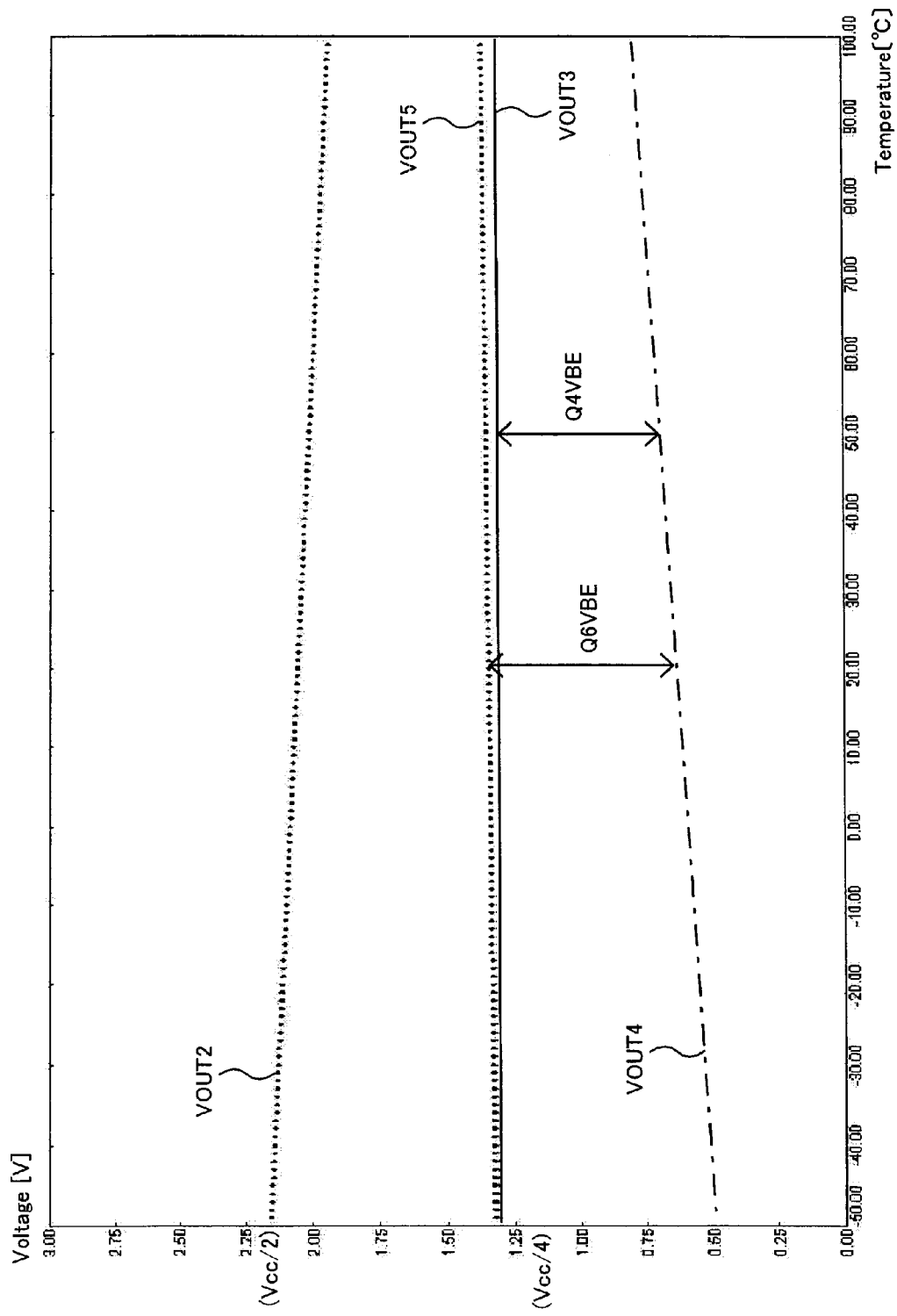
FIG. 7 is a diagram illustrating the temperature characteristics of main signals of the other amplitude setting circuit (case of the amplitude level deviating from Vcc/4) according to the first implementation of the invention.

In this case, as shown for example in FIG. 7, as to the sink power line side of the amplitude setting circuit 102, VOUT2 and VOUT4 are not completely opposite to each other in temperature characteristic. VOUT5 deviates above from potential of Vcc/4 and ascends as temperature goes from low to high. That is, VOUT5 varies with temperature. Accordingly, as shown in FIG. 7, by causing Q4VBE to be smaller by variation in VOUT5 with temperature than Q6VBE, variation in VOUT3 with temperature is removed.

A similar description applies to the source power line side of the amplitude setting circuit 102, potentials at both ends of the first diode-connected transistors (Q5, Q2) are not completely opposite to each other in temperature characteristic. Potential at the connection point of the first diode-connected transistors (Q5, Q2) deviates from potential of 3Vcc/4 and varies with temperature. Accordingly, variation with temperature in potential at the connection point of the first drive transistor Q1 and the fifth resistor R5 is corrected by removing an amount corresponding to variation with temperature in potential at the connection point of the first diode-connected transistors (Q5, Q2) from it.

Figure 18:
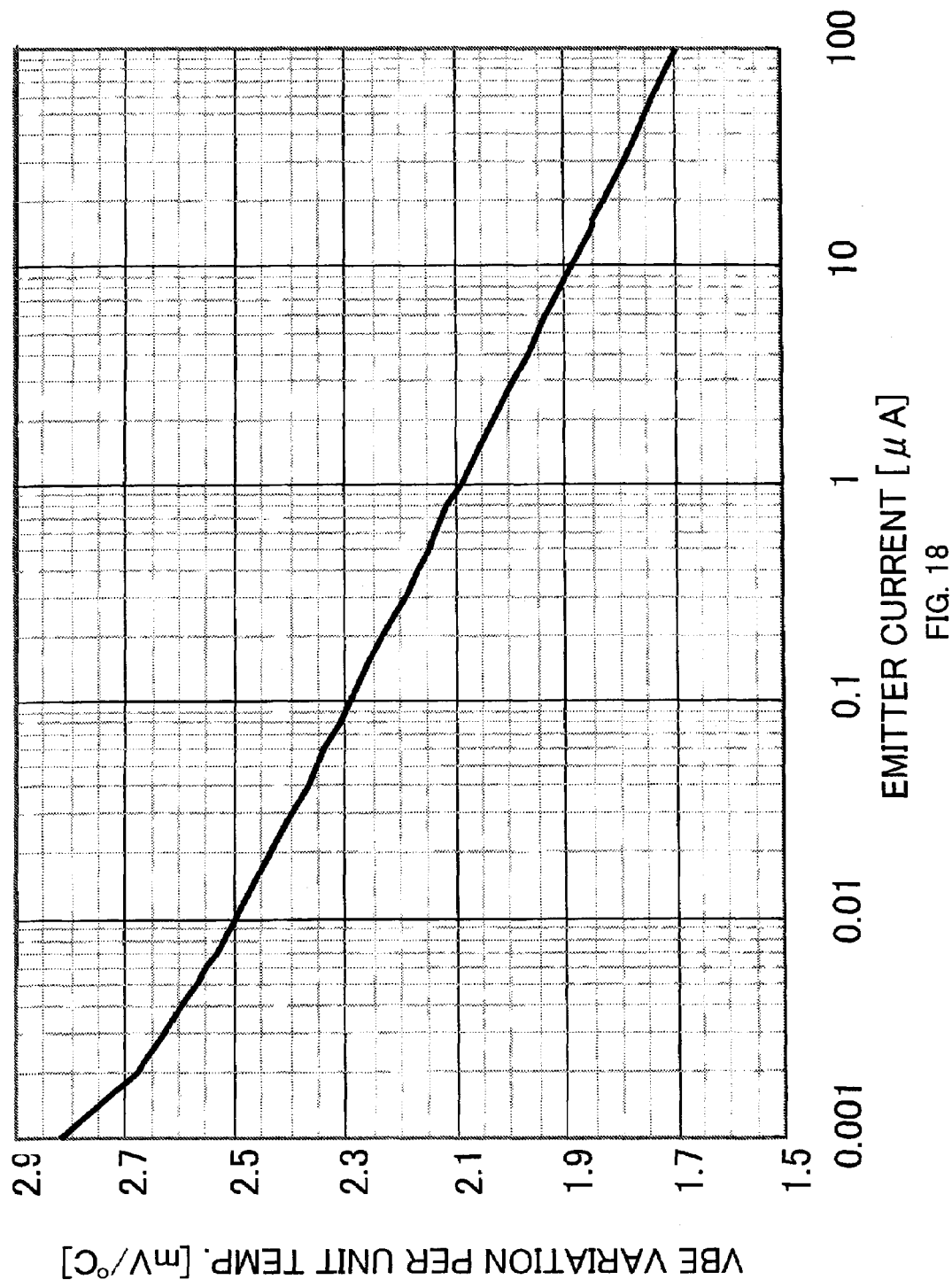
FIG. 18 is a diagram showing variation per unit temperature in the base-to-emitter voltage against the emitter current according to the invention.
Figure 19:
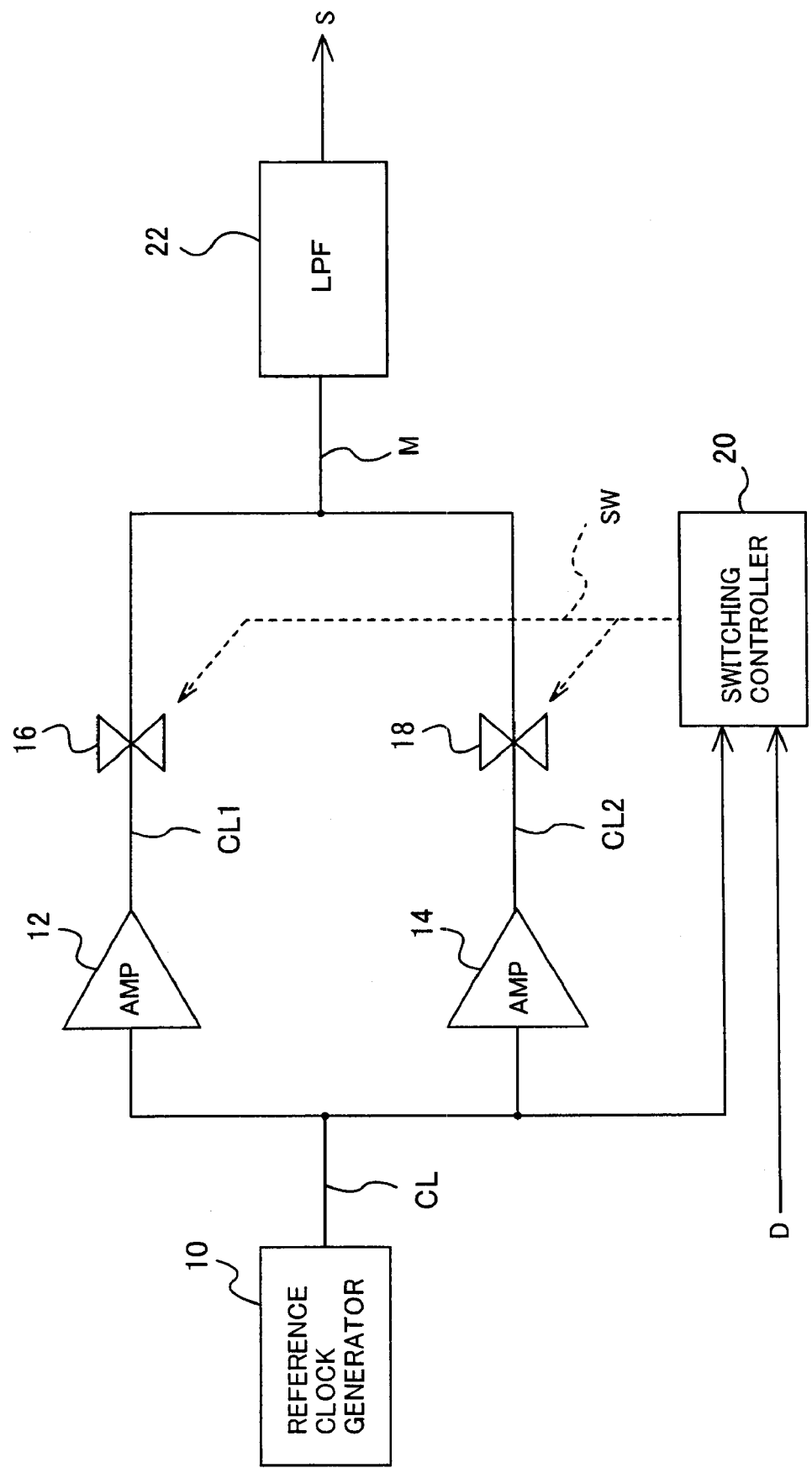
FIG. 19 is a diagram showing the configuration of a conventional ASK modulation circuit.

FIG. 17 shows an example of the temperature characteristic of the base-to-emitter voltage VBE of a typical transistor, and indicates how the base-to-emitter voltage VBE varies with the emitter current for temperature of −50, 25, and 100° C. As shown in FIG. 17, with the same emitter current, as temperature goes from low to high, potential of the base-to-emitter voltage VBE descends. It is seen that as the emitter current decreases, variation in the base-to-emitter voltage VBE with temperature becomes larger. FIG. 18 shows the rate of variation in the base-to-emitter voltage VBE with temperature.

Hence, the amplitude setting circuit 102 sets the L-side current Il flowing through the second drive transistor Q4 to be smaller than the reference side current Ir flowing through the second diode-connected transistor Q6 in order to cause Q4VBE to be smaller than Q6VBE. Also, the amplitude setting circuit 102 sets the H-side current Ih flowing through the first drive transistor Q1 to be smaller than the reference side current Ir flowing through the first diode-connected transistor Q5.

In order to set the L-side current Il and the H-side current Ih to be smaller than the reference side current Ir, the resistances of the first to sixth resistors (R1, R3, R4, R6, R2, R5) may be adjusted. However, if the currents are adjusted only through change of the resistances, the resistances have to be changed greatly. As a result, circuit scale and the currents change greatly. That is, the adjustment of the currents only through change of the resistances is difficult to perform for reasons of circuit restrictions.

Accordingly, as shown in FIG. 6, in the amplitude setting circuit 102, by connecting the plural first drive transistors (Q1, Q7) in parallel, an H-side current Ih flowing through each first drive transistor (Q1, Q7) is set smaller than the reference side current Ir flowing through the first diode-connected transistor Q5. Also, by connecting the plural second drive transistors (Q4, Q8) in parallel, an L-side current Il flowing through the second drive transistor Q4 is set smaller than the reference side current Ir flowing through the second diode-connected transistor Q6. As a result, the correction of removing the variation with temperature is achieved without greatly changing the currents and the resistances.

Furthermore, in the amplitude setting circuit 102, by enlarging the electrode area (emitter area) of the first drive transistor Q1 and the electrode area (emitter area) of the second drive transistor Q4, the respective densities of the currents flowing through the first and second drive transistors Q1, Q4 can be reduced. Thus, like with the above parallel connection, the correction of removing the variation with temperature can be achieved without greatly changing the currents and the resistances.

Second Implementation

<<Case of Amplitude Level being Set Low (Small Amplitude)>>

==Case of Amplitude being Zero==

Figure 8:
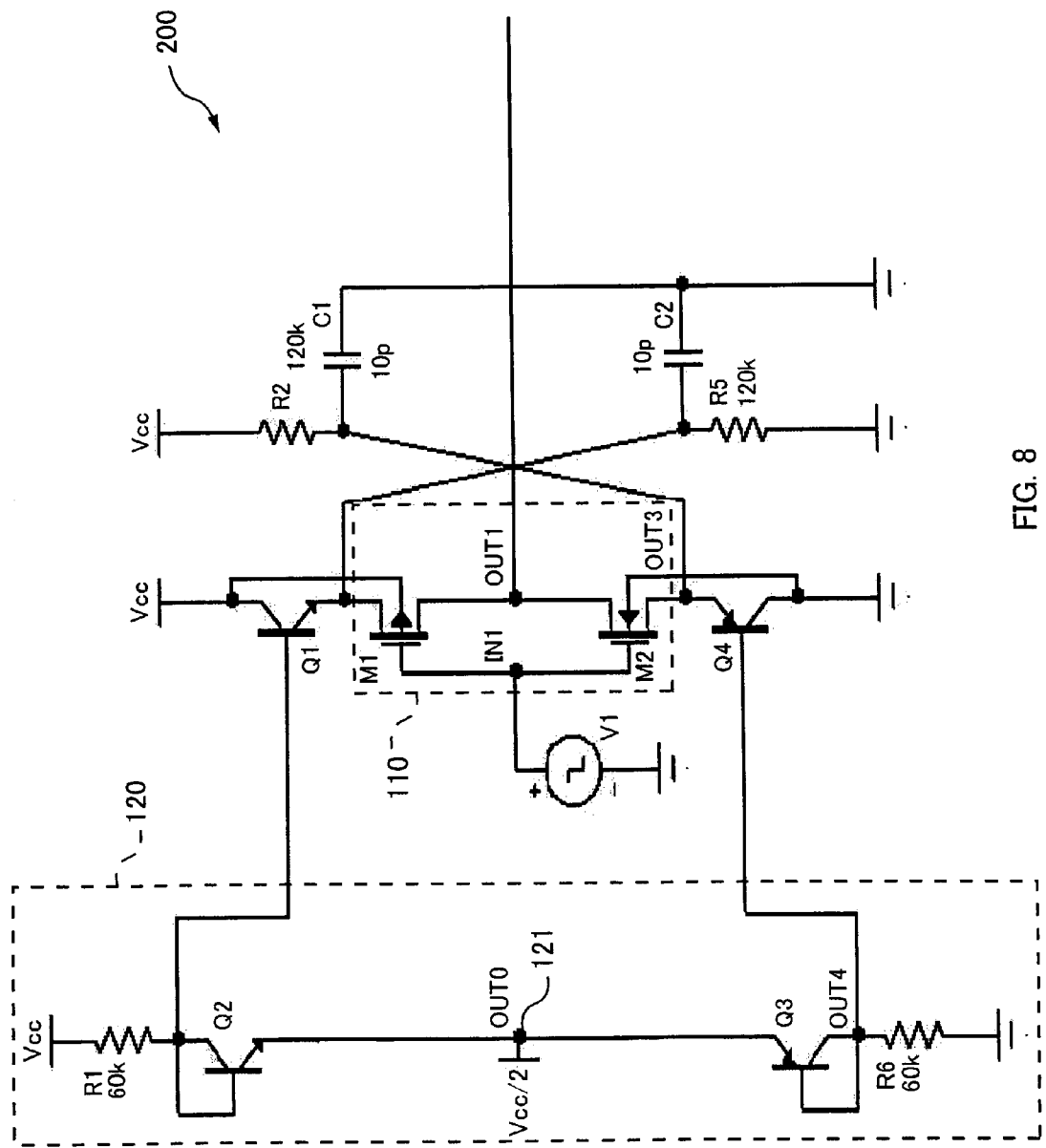
FIG. 8 is a diagram illustrating the configuration of an amplitude setting circuit (case of the amplitude being zero) according to a second implementation of the invention.

First, an amplitude setting circuit 200 of FIG. 8 according to a second implementation of the present invention will be described. The amplitude setting circuit 200 is a special case where the amplitude level of the output signal of the inverter 110 is set zero.

The amplitude setting circuit 200 differs from the fundamental configuration of FIG. 1 in that the second resistor R3 and the third resistor R4 are not provided. And the resistances of the fifth and sixth resistors R5, R2 are each set equal to the combined resistance of the first and fourth resistors R1, R6 (e.g., 120 kΩ), and the resistances of the first and fourth resistors R1, R6 are set equal (e.g., 60 kΩ). By this means, the reference side current Ir flowing through the first diode-connected transistor Q5 and the H-side current Ih flowing through the first drive transistor Q1 are set equal and the reference side current Ir flowing through the second diode-connected transistor Q6 and the L-side current Il flowing through the second drive transistor Q4 are set equal. As a result, as indicated by the equation (7), Q6VBE and Q4VBE become equal.

$$Q6VBE = Q4VBE \quad (7)$$

Potential (potential of Vcc/2) at the reference voltage application point 121, VOUT0, is higher by Q6VBE than VOUT4 as shown in the equation (8), and VOUT3 is higher by Q4VBE than VOUT4 as shown in the equation (9). From the equations (6) to (9), VOUT0 and VOUT3 each coincide with potential of Vcc/2. Hence, the amplitude level of the output signal of the inverter 110 is set zero:

$$VOUT0 = VOUT4 + Q6VBE \quad (8)$$

$$VOUT3 = VOUT4 + Q4VBE \quad (9)$$

Figure 9:
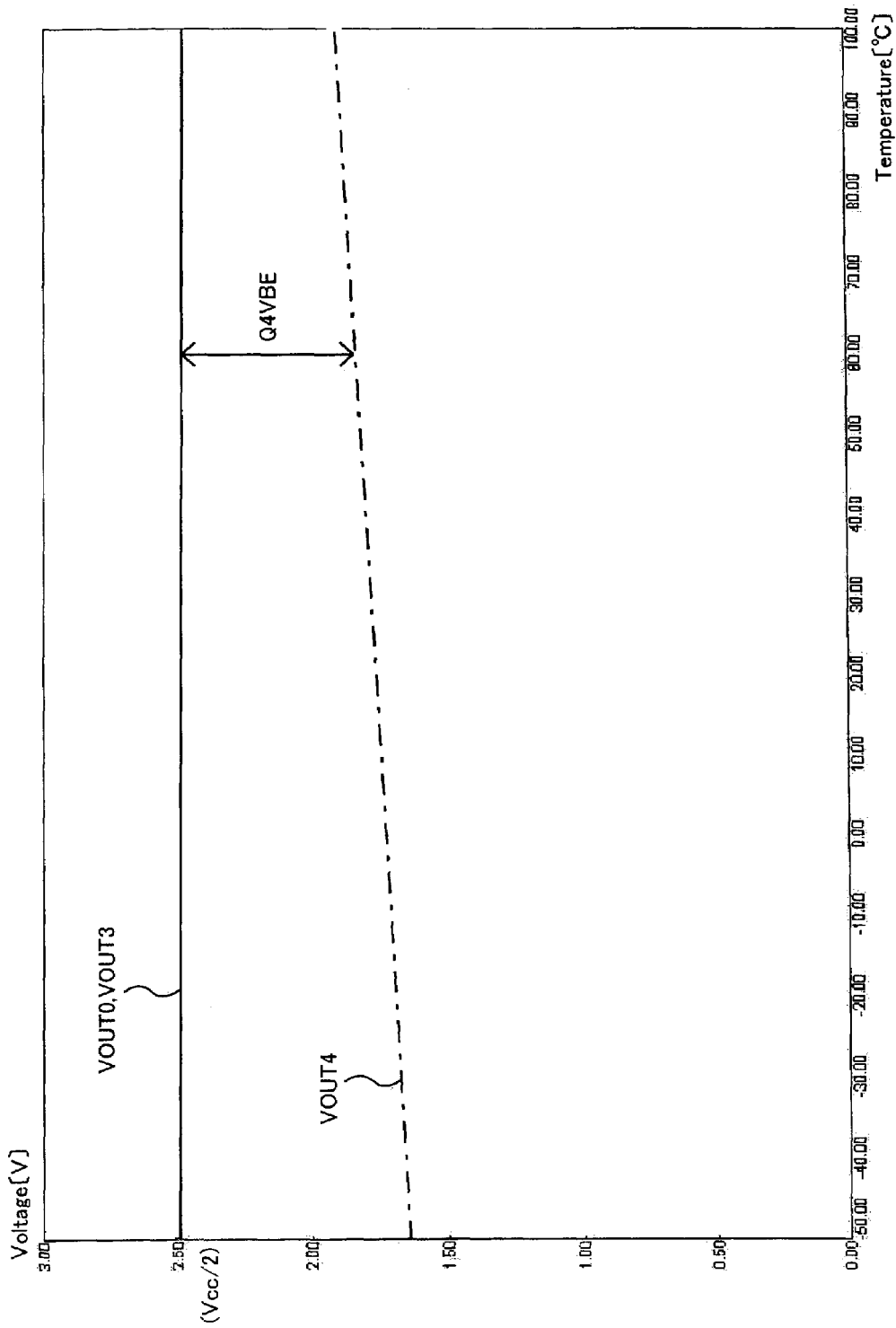
FIG. 9 is a diagram illustrating the temperature characteristics of main signals of the amplitude setting circuit (case of the amplitude being zero) according to the second implementation of the invention.

FIG. 9 shows the temperature characteristics of main strobe points VOUT0, VOUT3, VOUT4 of the amplitude setting circuit 200. As shown in the Figure, potentials at VOUT0 and VOUT3 each coincide with potential of Vcc/2, and the source power line side and the sink power line side of the voltage divider 120 are configured to be symmetrical. Hence, the variation with temperature is removed.

==Case of Amplitude Level being Set to Deviate From Zero==

Figure 10:
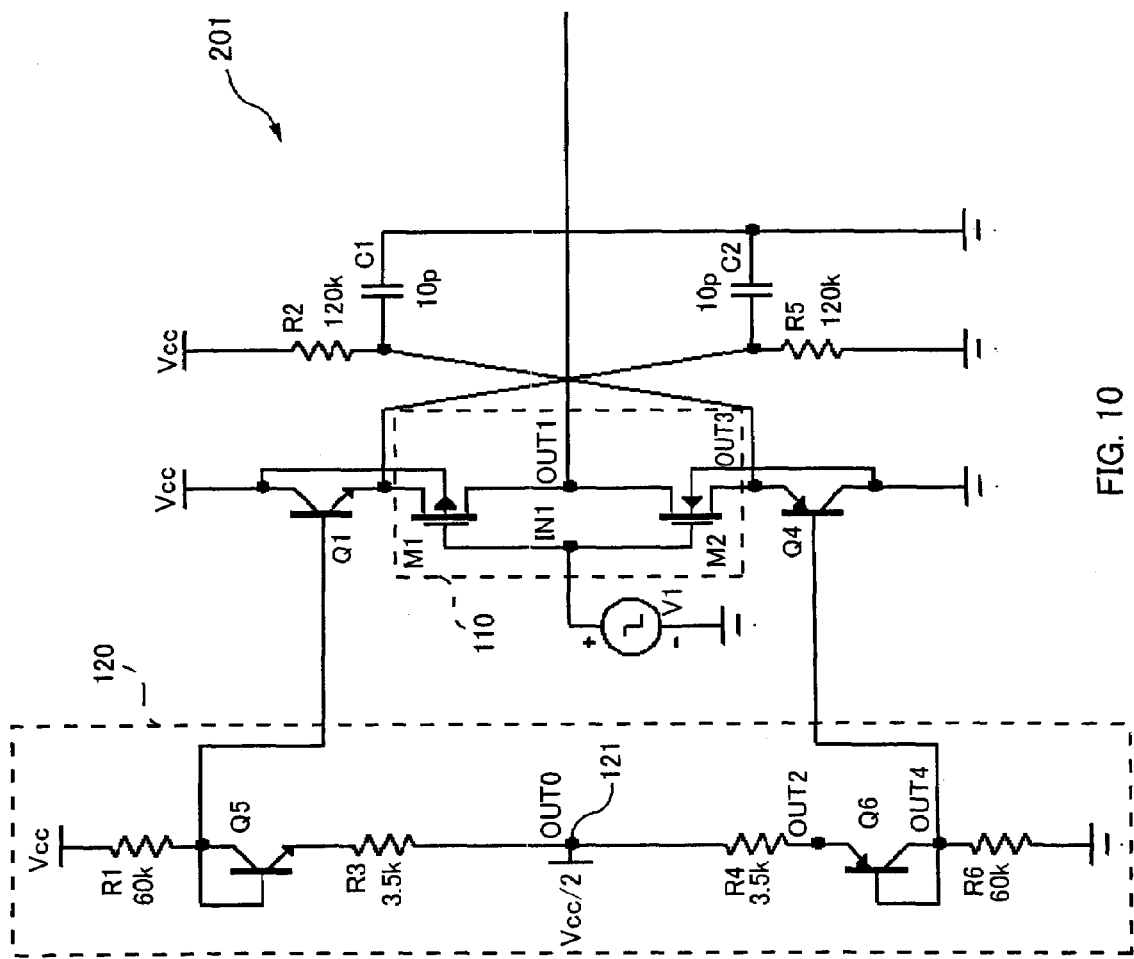
FIG. 10 is a diagram illustrating the configuration of an amplitude setting circuit (case of the amplitude level being low) according to the second implementation of the invention.

Next, an amplitude setting circuit 201 of FIG. 10 according to the second implementation of the present invention will be described. The amplitude setting circuit 201 differs from the amplitude setting circuit 200 of FIG. 8 in that the second resistor R3 and the third resistor R4 are provided in the voltage divider 120. The resistances of the second and third resistors R3, R4 are set such that potential at VOUT3 becomes lower by an amount corresponding to the amplitude level than potential at VOUT0, on the sink power line side of the amplitude setting circuit 201. In the example of FIG. 10, the amplitude level is set to 0.1 V with the resistances of the second resistor R3 and the third resistor R4 set to 3.5 kΩ.

Figure 11:
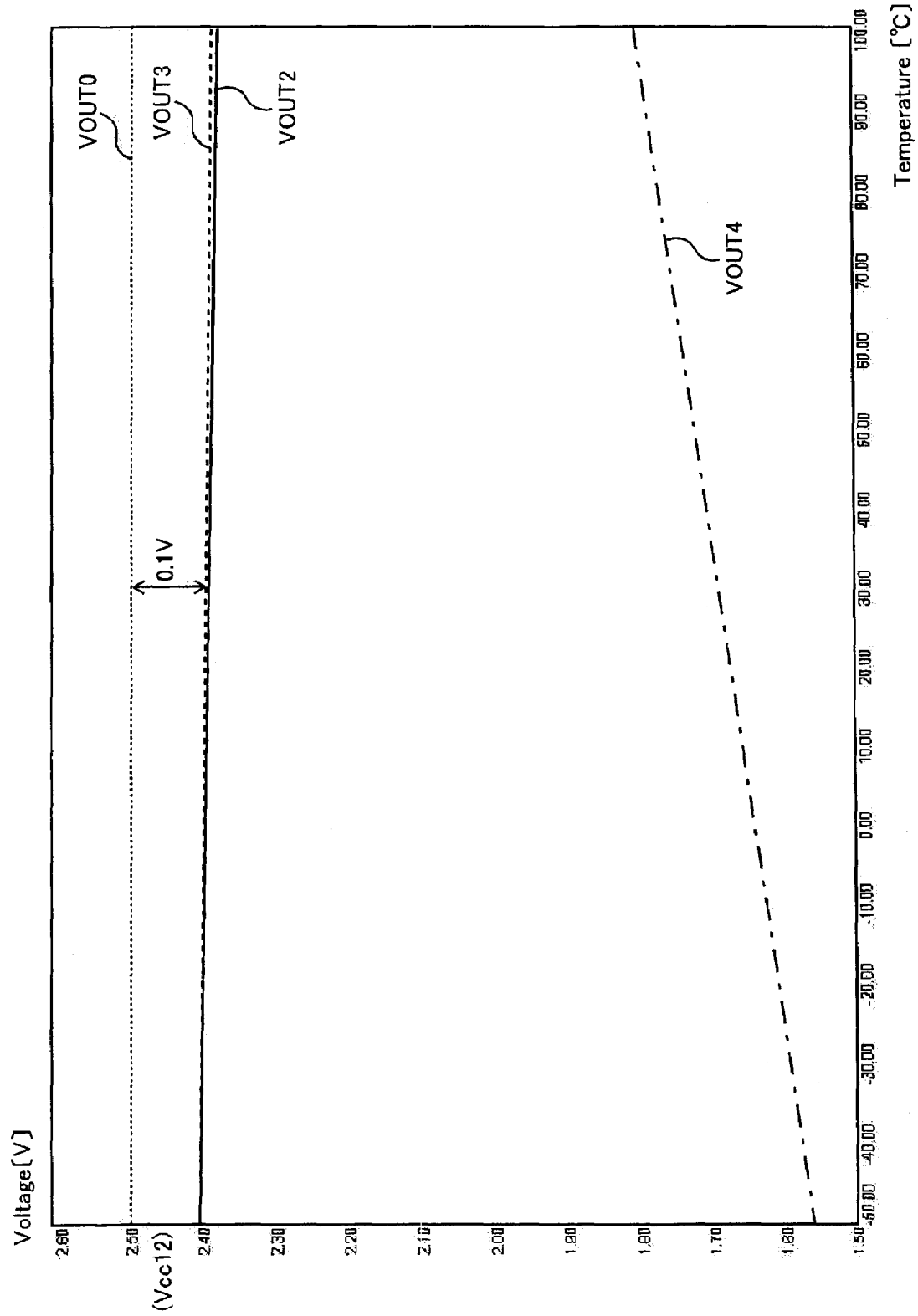
FIG. 11 is a diagram illustrating the temperature characteristics of main signals of the amplitude setting circuit (case of the amplitude level being low) according to the second implementation of the invention.

FIG. 11 shows the temperature characteristics of main strobe points VOUT0, VOUT2, VOUT3, VOUT4 of the amplitude setting circuit 201. As shown in the Figure, potential at VOUT3 is 0.1 V lower than potential of Vcc/2 at VOUT0. Since the second resistor R3 and the third resistor R4 are newly added, the reference side current Ir is accordingly smaller than the L-side current Il. Thus, variation in Q6VBE with temperature is greater than variation in Q4VBE on the basis of the characteristic shown in FIG. 18.

Here, VOUT2 and VOUT3 are expressed by the equations (10) and (11) respectively. Q6VBE and Q4VBE decrease as temperature goes from low to high on the basis of the characteristic shown in FIG. 17. Thus, potentials at VOUT2 and VOUT3 descend as temperature goes from low to high. Moreover, variation in VOUT2 with temperature is greater than variation in VOUT3. As such, VOUT2 and VOUT3 deviate from VOUT0 while varying with temperature:

$$VOUT2 = VOUT4 + Q6VBE \qquad (10)$$

$$VOUT3 = VOUT4 + Q4VBE \qquad (11)$$

In order to make Q6VBE smaller than Q4VBE, the reference side current Ir flowing through the second diode-connected transistor Q6 is set smaller than the L-side current Il flowing through the second drive transistor Q4. By this means, the correction of removing the variation in VOUT3 with temperature is achieved. A similar description applies to the source power line side of the amplitude setting circuit 201. That is, in order to make VBE of the first diode-connected transistor Q5 smaller than VBE of the first drive transistor Q1, the reference side current Ir flowing through the first diode-connected transistor Q5 is set smaller than the H-side current Ih flowing through the first drive transistor Q1. By this means, variation with temperature in potential at the connection point of the first drive transistor Q1 and the fifth resistor R5 is removed.

In order to set the reference side current Ir to be smaller than the L-side current Il and the H-side current Ih, the resistances of the first to sixth resistors (R1, R3, R4, R6, R2, R5) may be adjusted. However, if the currents are adjusted only through change of the resistances, the resistances have to be changed greatly. As a result, circuit scale and the currents change greatly. The adjustment of the currents only through change of the resistances is difficult to perform for reasons of circuit restrictions.

Figure 12:
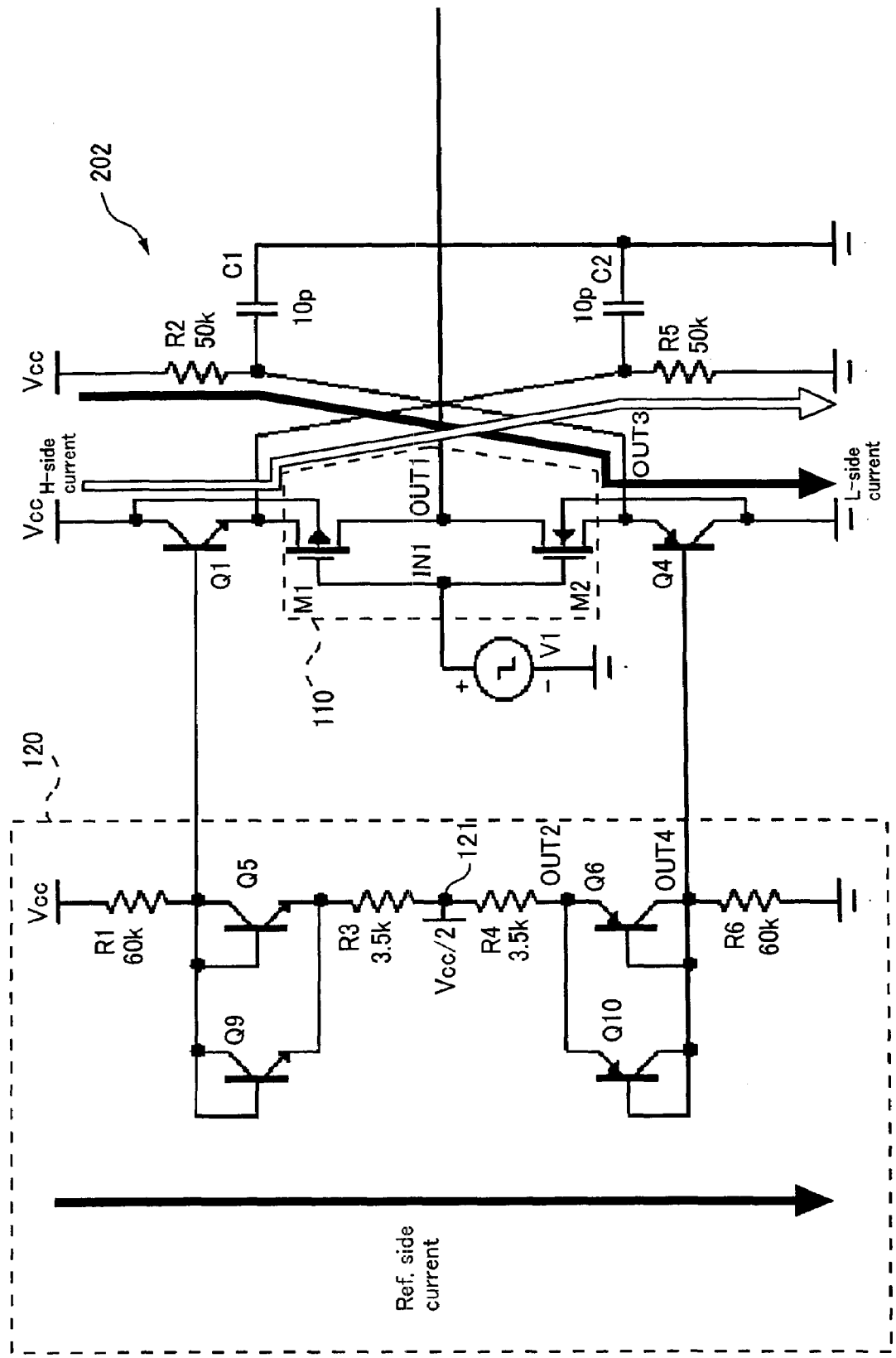
FIG. 12 is a diagram illustrating the configuration of an amplitude setting circuit (case of the amplitude level being low) according to the second implementation of the invention.

Accordingly, as shown in FIG. 12, in the amplitude setting circuit 202 according to the second implementation of the invention, by connecting the plural first diode-connected transistors (Q5, Q9) in parallel, the reference side current Ir is set smaller than an H-side current Ih of each transistor. Also, by connecting the plural second diode-connected transistors (Q6, Q10) in parallel, the reference side current Ir is set smaller than an L-side current Il of each transistor. As a result, the correction of removing the variation with temperature is achieved without greatly changing the currents and the resistances.

Furthermore, for the amplitude setting circuit 202, by enlarging the electrode area (emitter area) of the first diode-connected transistor Q5 and the electrode area (emitter area) of the second diode-connected transistor Q6, the respective densities of the currents flowing through the first and second diode-connected transistors Q5, Q6 can be reduced. Thus, like with the above parallel connection, the correction of removing the variation with temperature is achieved without greatly changing the currents and the resistances.

==Example of Adjustment==

Figure 13:
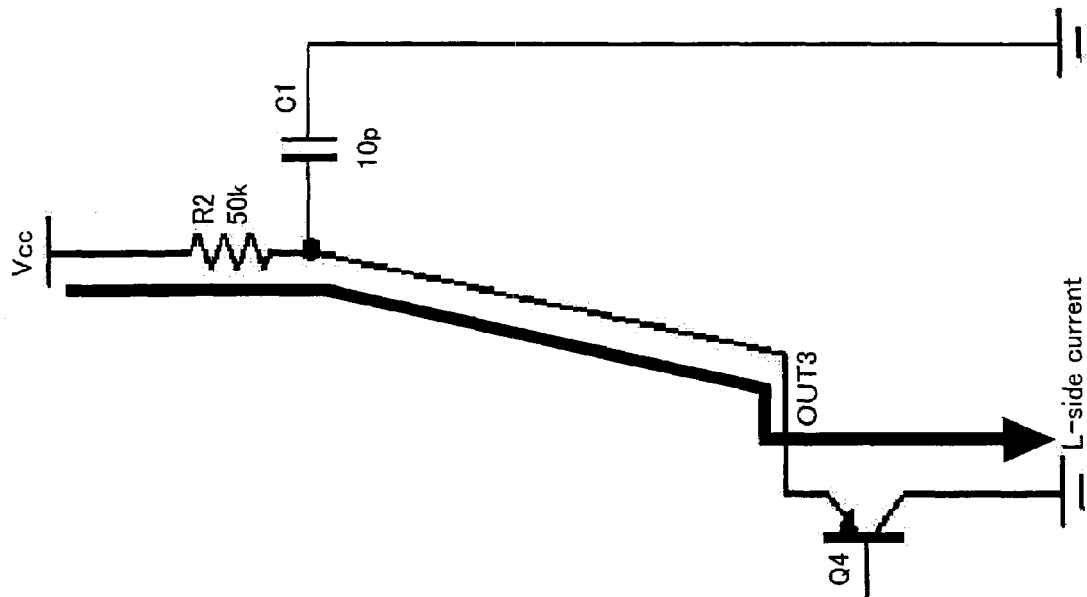
FIG. 13 is a diagram showing the configuration on the sink power line side of the amplitude setting circuit (case of the amplitude level being low) according to the second implementation of the invention.
Figure 13:
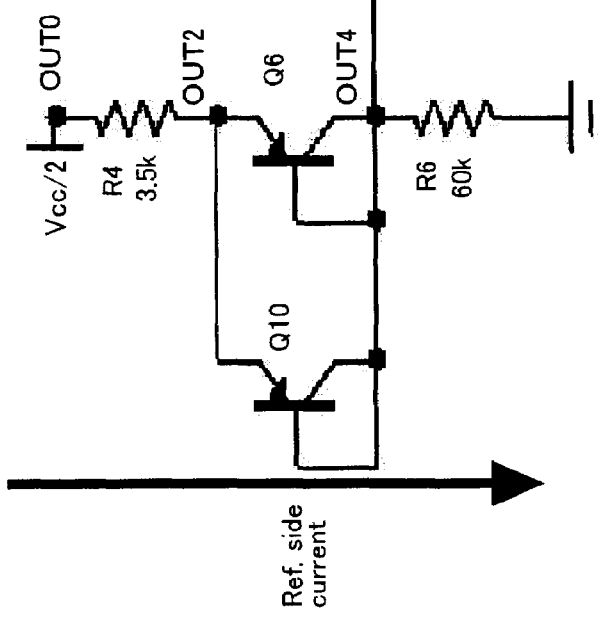

A description will be made with reference to the configuration on the sink power line side of the amplitude setting circuit 202 of FIG. 13 for simplification of description.

First, take a target value for the reference side current Ir, the H-side current Ih, and the L-side current Il to be 30 μA, which results in that the target value of the emitter current for each of the two second diode-connected transistors (Q6, Q10) is 15 μA because they are connected in parallel, and Q3VBE, Q6VBE, Q4VBE to be 0.65 V, and Vcc potential of the source power line and GND potential of the sink power line to be 5.0 V and 0.0 V respectively. In this case, the reference voltage (Vcc/2) that is applied to the reference voltage application point 121 is 2.5 V.

In this case, its resistance to cause the reference side current Ir of 30 μA to flow through the voltage divider 120 is 60 kΩ as shown by the equation (12):

$$R4+R6=(2.5\ V-0.65\ V)\div30\ \mu A=60\ k\Omega \qquad (12)$$

Here, to set the amplitude level of the output signal of the inverter 110 to 50 mV, the voltage across the third resistor R4 is set to 50 mV. In this case, the resistance of the third resistor R4 becomes 2 kΩ as shown by the equation (13). This value is finely adjusted later. Also, from the equation (12) the resistance of the fourth resistor R6 is 58 kΩ, but is set to 60 kΩ selected as a whole number:

$$R4=50\ mV\div30\ \mu A\approx2\ k\Omega \qquad (13)$$

Figure 14:
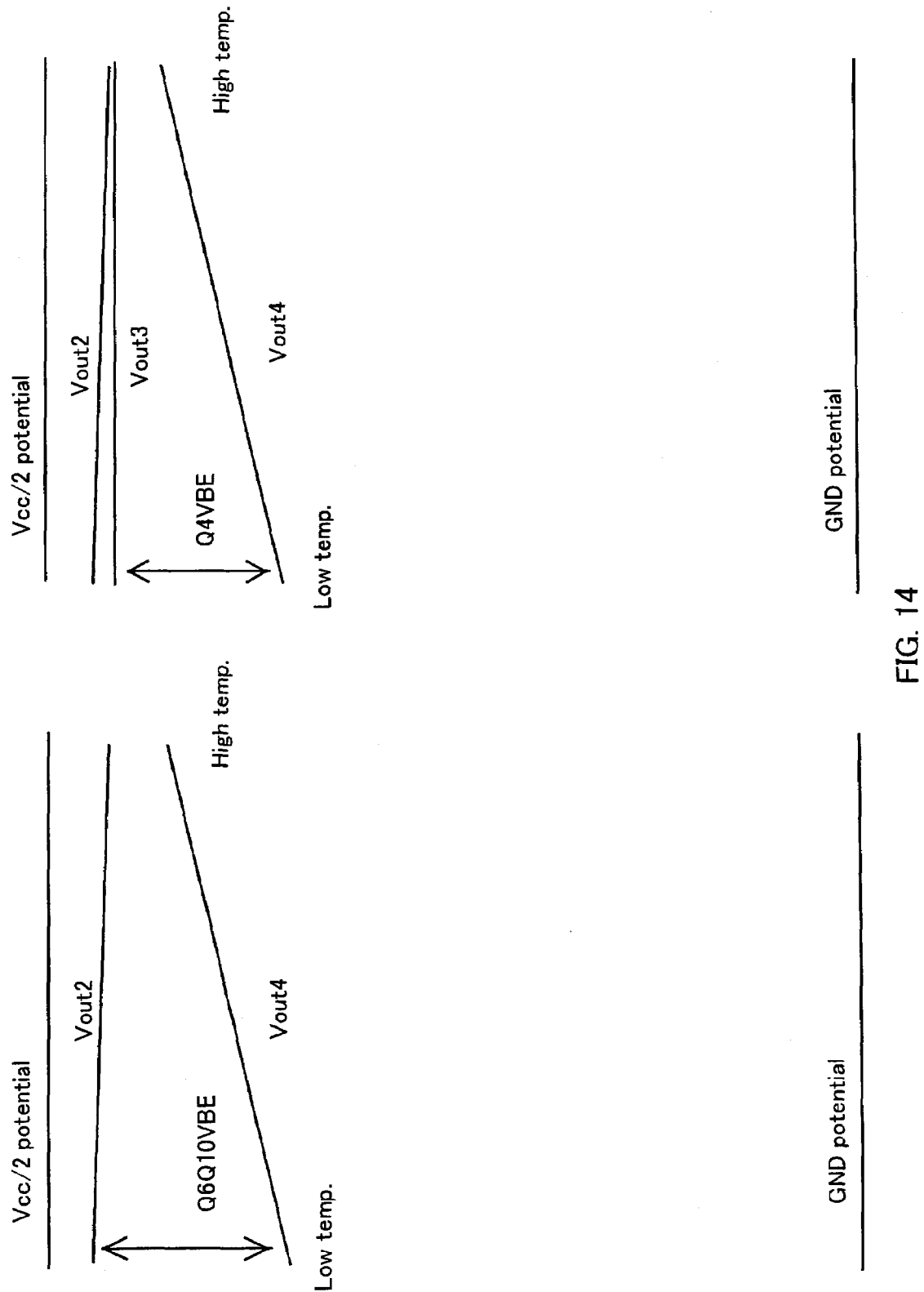
FIG. 14 is a diagram schematically showing the temperature characteristics of main signals of the amplitude setting circuit (case of the amplitude level being low) according to the second implementation of the invention.

FIG. 14 schematically shows the temperature characteristics of main strobe points on the sink power line side of the amplitude setting circuit 202. As shown in the FIG. 11, potential at VOUT2 descends and potential at VOUT4 ascends as temperature goes from low to high. The gradient of the temperature characteristic of VOUT2 is smaller than that of VOUT4. Also, VOUT2 stays close to potential of Vcc/2. Hence, by setting Q4VBE smaller than Q6VBE and Q10VBE, variation in VOUT3 with temperature is removed.

Figure 15:
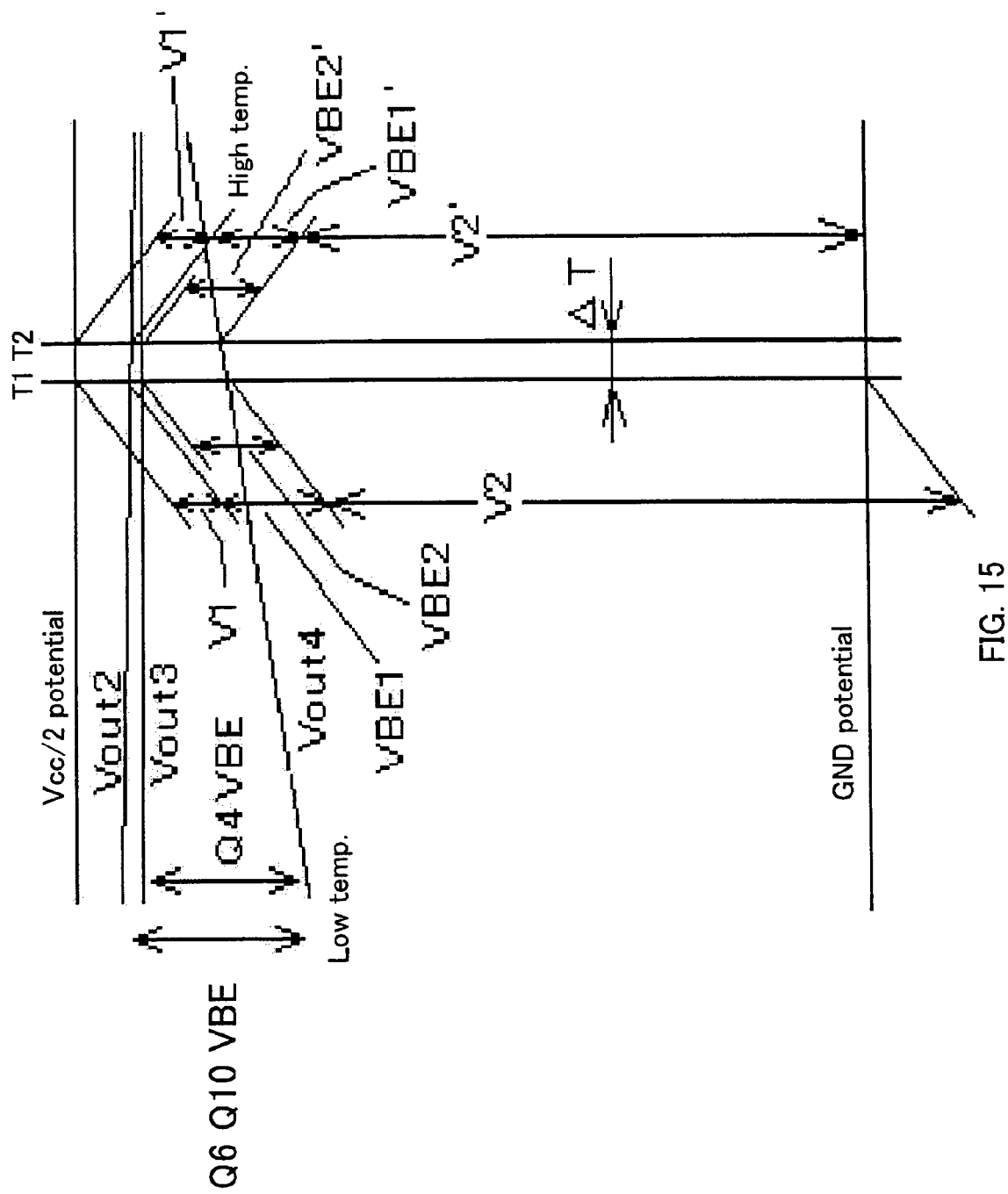
FIG. 15 is a diagram schematically showing the temperature characteristics of the main signals of the amplitude setting circuit (case of the amplitude level being low) according to the second implementation of the invention.

Here, removing variation in VOUT3 with temperature will be described in detail with reference to FIG. 15 that indicates potentials at strobe points when temperature varies by ΔT.

As to their values at temperature of T1, let V2 be VOUT4, VBE1 be Q6VBE and Q10VBE, and VBE2 be Q4VBE. Then, V2 and VOUT3 are expressed by the equations (14), (15) respectively:

$$V2=(Vcc/2-VBE1)\times((R6\div(R4+R6)) \qquad (14)$$

$$VOUT3=V2+VBE2=(Vcc/2-VBE1)\times((R6\div(R4+R6))+ VBE2 \quad (15)$$

As to their values at temperature of T2 (=T1+ΔT), let V2' be VOUT4, VBE1' be Q6VBE and Q10VBE, and VBE2' be Q4VBE. Then, VOUT3' is expressed by the equation (16):

$$VOUT3'=(Vcc/2-VBE1')\times((R6\div(R4+R6))+VBE2' \quad (16)$$

Here, if VOUT3 and VOUT3' are equal, the variation in VOUT3 with temperature is zero. To this end, from the equations (15) and (16), the equation (17) needs to be satisfied:

$$((R6\div(R4+R6))\times\Delta VBE1-\Delta VBE2=0 \quad (17),$$

where ΔVBE1=VBE1−VBE1' and ΔVBE2=VBE2−VBE2'.

The equation (17) is rewritten as the equation (18). By setting the resistance of the third resistor R4 according to the equation (18), the variation in VOUT3 with temperature is removed:

$$R4=R6\times(\Delta VBE1-\Delta VBE2)\div\Delta VBE2 \quad (18)$$

Here, from the graph of FIG. 18, if the emitter current is 15 μA, variation per 1° C. in VBE of the transistor is 1.85 mV/° C. If the emitter current is 50 μA, variation per 1° C. in VBE of the transistor is 1.75 mV/° C. By substituting these values into the equation (18), the resistance of the third resistor R4 is found to be 3.5 kΩ:

$$R4=60\ k\Omega\times(1.85\ mV-1.75\ mV)\div1.75\ mV\approx3.5\ k\Omega \quad (19)$$

Figure 16:
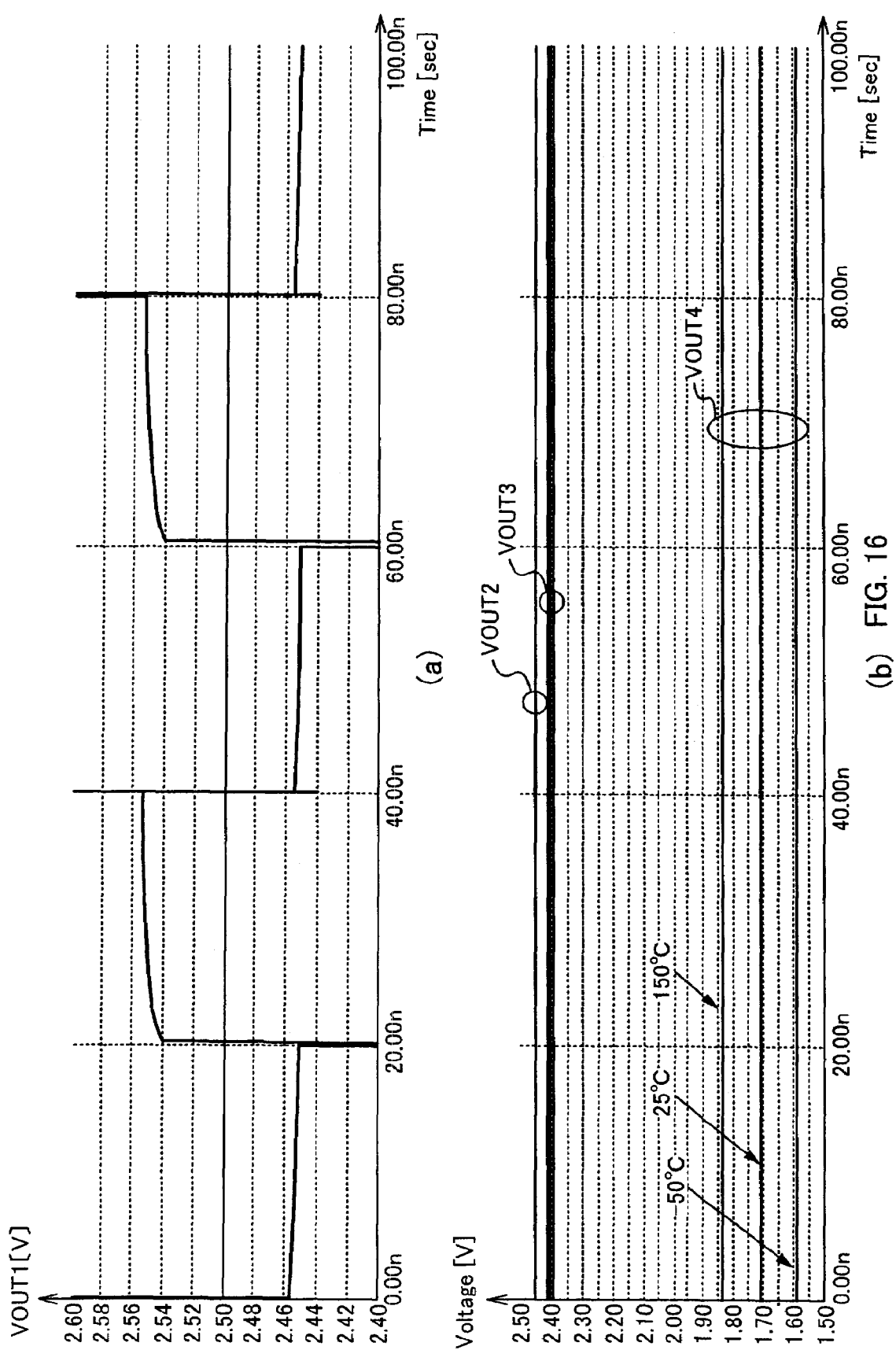
FIG. 16 shows (a) the waveform of the output signal VOUT1 of the amplitude setting circuit (case of the amplitude level being low) according to the second implementation of the invention and (b) the temperature characteristics of main signals of the amplitude setting circuit (case of the amplitude level being low) according to the second implementation of the invention.

Therefore, the resistance of the third resistor R4 tentatively set to 2 kΩ is changed to 3.5 kΩ. FIG. 16 shows the simulation waveforms of main signals of the amplitude setting circuit 202 for when these circuit constants are set. FIG. 16(a) shows the simulation waveform of the output signal VOUT1 of the inverter 110, and FIG. 16(b) shows the simulation waveforms of main strobe points VOUT2, VOUT3, VOUT4 of the amplitude setting circuit 202 for temperature of −50, 25, and 150° C. respectively. As seen from FIG. 16(b), the variation in VOUT3 with temperature is removed, and as seen from FIG. 16(a), the variation in the output signal VOUT1 of the inverter 110 with temperature is removed.

Although the implementations of the present invention have been described, the above implementations are provided to facilitate the understanding of the present invention and not intended to limit the present invention. It should be understood that various changes and alterations can be made therein without departing from spirit and scope of the invention and that the present invention includes its equivalents.

Although in the present implementation, a P-type MOS transistor and a N-type MOS transistor are employed for the first conductivity-type transistor M1 and the second conductivity-type transistor M2 respectively, the other type of transistor is employable herein. For example, a P-type MOS transistor and a N-type MOS transistor are employable for the second conductivity-type transistor M2 and the first conductivity-type transistor M1 respectively. Further, alternatively bipolar transistors may be used for the first and second conductivity-type transistor M1, M2.

Furthermore, although in the present implementation, NPN-type bipolar transistors are employed as the first drive transistor Q1 and two of the first diode-connected transistors Q2, Q5 and PNP-type bipolar transistors are employed for the second drive transistor Q4 and two of the second diode-connected transistors Q6, Q3, the other type of transistor is also employable herein. For example, PNP-type bipolar transistors may be used as the first drive transistor Q1 and two of the first diode-connected transistors Q2, Q5 and NPN-type bipolar transistors may be used as the second drive transistor Q4 and two of the second diode-connected transistors Q6, Q3.

What is claimed is:

1. An amplitude setting circuit for setting an amplitude level of its output signal corresponding to an input signal, comprising:

an inverter that has a first conductivity-type transistor (M1) and a second conductivity-type transistor (M2) connected in series in between a source power line and a sink power line which complementarily become conductive and outputs the output signal into which the input signal has been inverted in logic level;

a first drive transistor (Q1) that is provided between the source power line and the first conductivity-type transistor (M1) and drives the first conductivity-type transistor (M1);

a second drive transistor (Q4) that is provided between the second conductivity-type transistor (M2) and the sink power line and drives the second conductivity-type transistor (M2);

a voltage divider that has a first resistor (R1), a first diode-connected transistor (Q5), a second resistor (R3), a third resistor (R4), a second diode-connected transistor (Q6), and a fourth resistor (R6) connected in series between the source power line and the sink power line and applies potential of a control electrode of the first diode-connected transistor (Q5) to a control electrode of the first drive transistor (Q1) and applies potential of a control electrode of the second diode-connected transistor (Q6) to a control electrode of the second drive transistor (Q4);

a fifth resistor (R5) that is provided between a first connection point of the first drive transistor (Q1) and the first conductivity-type transistor (M1), and the sink power line and adjusts a current flowing through the first drive transistor (Q1); and a sixth resistor (R2) that is provided between the source power line and a second connection point of the second conductivity-type transistor (M2) and the second drive transistor (Q4) and adjusts a current flowing through the second drive transistor (Q4), wherein by setting a current flowing through the first diode-connected transistor (Q5) and the current flowing through the first drive transistor (Q1) to be in a predetermined relationship, variation with temperature in potential at the first connection point is removed, and by setting a current flowing through the second diode-connected transistor (Q6) and the current flowing through the second drive transistor (Q4) to be in a predetermined relationship, variation with temperature in potential at the second connection point is removed.

2. The amplitude setting circuit according to claim 1, wherein two of the first diode-connected transistors (Q5) are connected in series between the first resistor (R1) and the second resistor (R3), and two of the second diode-connected transistors (Q6) are connected in series between the third resistor (R4) and the fourth resistor (R6), wherein the two of the first diode-connected transistors (Q5, Q2) are of the same type as the first drive transistor (Q1), and the two of the second diode-connected transistors (Q6, Q3) are of the same type as the second drive transistor (Q4), wherein potential at a connection point of the two of the first diode-connected transistors (Q5, Q2) is set to three fourths of a potential difference between the source power line and the sink power line, and potential at a connection point of the two of the second diode-connected transistors (Q6, Q3) is set to one fourth of the potential difference between the source power line and the sink power line, and wherein by setting the current flowing through the first diode-connected transistor (Q5) and the current flowing through the first drive transistor (Q1) to be equal, variation with temperature in potential at the first connection point is removed, and by setting the current flowing through the second diode-connected transistor (Q6) and the current flowing through the second drive transistor (Q4) to be equal, variation with temperature in potential at the second connection point is removed.

3. The amplitude setting circuit according to claim 2, wherein potential at a connection point of the two of the first diode-connected transistors (Q5, Q2) is set to deviate from the three fourths of a potential difference between the source power line and the sink power line, and potential at a connection point of the two of the second diode-connected transistors (Q6, Q3) is set to deviate from the one fourth of the potential difference between the source power line and the sink power line, and wherein part of variation with temperature in potential at the first connection point that occurs due to the deviation from the three fourths is removed by setting the current flowing through the first drive transistor (Q1) to be smaller than the current flowing through the first diode-connected transistor (Q5), and part of variation with temperature in potential at the second connection point that occurs due to the deviation from the one fourth is removed by setting the current flowing through the second drive transistor (Q4) to be smaller than the current flowing through the second diode-connected transistor (Q6).

4. The amplitude setting circuit according to claim 3, wherein by connecting a plurality of the first drive transistors (Q1) in parallel, a current flowing through the first drive transistor (Q1) is set smaller than the current flowing through the first diode-connected transistor (Q5), and wherein by connecting a plurality of the second drive transistors (Q4) in parallel, a current flowing through the second drive transistor (Q4) is set smaller than the current flowing through the second diode-connected transistor (Q6).

5. The amplitude setting circuit according to claim 3, wherein by enlarging an electrode area of the first drive transistor (Q1), the current flowing through the first drive transistor (Q1) is set smaller than the current flowing through the first diode-connected transistor (Q5), and wherein by enlarging an electrode area of the second drive transistor (Q4), the current flowing through the second drive transistor (Q4) is set smaller than the current flowing through the second diode-connected transistor (Q6).

6. The amplitude setting circuit according to claim 1, wherein the first diode-connected transistor (Q5) is of the same type as the first drive transistor (Q1), and the second diode-connected transistor (Q6) is of the same type as the second drive transistor (Q4), wherein potential at a connection point of the first diode-connected transistor (Q5) and the second resistor (R3) is set to deviate from half of the potential difference between the source power line and the sink power line, and potential at a connection point of the third resistor (R4) and the second diode-connected transistor (Q6) is set to deviate from half of the potential difference between the source power line and the sink power line, wherein part of variation with temperature in potential at the first connection point that occurs due to the deviation from the half is removed by setting the current flowing through the first diode-connected transistor (Q5) to be smaller than the current flowing through the first drive transistor (Q1), and wherein part of variation with temperature in potential at the second connection point that occurs due to the deviation from the half is removed by setting the current flowing through the second diode-connected transistor (Q6) to be smaller than the current flowing through the second drive transistor (Q4).

7. The amplitude setting circuit according to claim 6, wherein by connecting a plurality of the first diode-connected transistors (Q5) in parallel, a current flowing through the first diode-connected transistor (Q5) is set smaller than the current flowing through the first drive transistor (Q1), and wherein by connecting a plurality of the second diode-connected transistors (Q6) in parallel, a current flowing through the second diode-connected transistor (Q6) is set smaller than the current flowing through the second drive transistor (Q4).

8. The amplitude setting circuit according to claim 6, wherein by enlarging an electrode area of the first diode-connected transistor (Q5), the current flowing through the first diode-connected transistor (Q5) is set smaller than the current flowing through the first drive transistor (Q1), and wherein by enlarging an electrode area of the second diode-connected transistor (Q6), the current flowing through the second diode-connected transistor (Q6) is set smaller than the current flowing through the second drive transistor (Q4).

9. The amplitude setting circuit according to claim 1, wherein a reference voltage of the same level as a predetermined operating voltage of an amplifier connected at the subsequent stage to the inverter is applied to a connection point of the second and third resistors (R3, R4).

10. The amplitude setting circuit according to claim 1, wherein the first and second diode-connected transistors (Q5, Q6) and the first and second drive transistors (Q1, Q4) are bipolar transistors.

11. The amplitude setting circuit according to claim 1, wherein one electrode of a capacitor (C1) whose other electrode is connected to the sink power line is connected to a connection point of the sixth resistor (R2) and the second drive transistor (Q4), and one electrode of a capacitor (C2) whose other electrode is connected to the sink power line is connected to a connection point of the first drive transistor (Q1) and the fifth resistor (R5).

12. An amplitude setting circuit comprising:

an inverter including a first conductivity-type transistor and a second conductivity-type transistor which are connected in series between a source power line and a sink power line and which are configured to operate complementarily, the inverter being configured to output an output signal whose logic level is different from a logic level of an input signal;

a first drive transistor connected between the source power line and the first conductivity-type transistor;

a second drive transistor connected between the second conductivity-type transistor and the sink power line;

a first resistor connected between a connection point of the first conductivity-type transistor and the first drive transistor, and the sink power line;

a second resistor connected between a connection point of the second conductivity-type transistor and the second drive transistor, and the source power line; and a voltage divider including a first diode-connected transistor and a second diode-connected transistor which are connected in series between the source power line and the sink power line, the first diode-connected transistor and the second diode-connected transistor being current-mirror connected respectively to the first drive transistor and the second drive transistor, each control electrode of the first diode-connected transistor and the second diode-connected transistor being applied with a voltage corresponding to an amplitude level of the output signal, variation with temperature in potential at a connection point of the first drive transistor and the first conductivity-type transistor being removed, when a current flowing through the first drive transistor and a current flowing through the first diode-connected transistor are set to be in a predetermined relationship, and variation with temperature in potential at a connection point of the second drive transistor and the second conductivity-type transistor being removed, when a current flowing through the second drive transistor and a current flowing through the second diode-connected transistor are set to be in a predetermined relationship.

13. The amplitude setting circuit according to claim 12, wherein a voltage identical in level to a direct current voltage to become a reference voltage when an amplifier connected at a subsequent stage to the inverter operates, is applied to a connection point between the first diode-connected transistor and the second diode-connected transistor.

* * * * *